(12) United States Patent
Saitoh et al.

(10) Patent No.: US 7,838,945 B2
(45) Date of Patent: Nov. 23, 2010

(54) SEMICONDUCTOR DEVICE AND MANUFACTURING METHOD THEREOF

(75) Inventors: Motofumi Saitoh, Tokyo (JP); Hirohito Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 195 days.

(21) Appl. No.: 12/093,666

(22) PCT Filed: Oct. 18, 2006

(86) PCT No.: PCT/JP2006/320702

§ 371 (c)(1),
(2), (4) Date: May 14, 2008

(87) PCT Pub. No.: WO2007/058042

PCT Pub. Date: May 24, 2007

(65) Prior Publication Data

US 2009/0096032 A1   Apr. 16, 2009

(30) Foreign Application Priority Data

Nov. 16, 2005  (JP) .............................. 2005-331901

(51) Int. Cl.
    *H01L 29/76* (2006.01)
(52) U.S. Cl. .............................. 257/369; 257/E27.062; 257/E27.064; 257/E21.636; 438/218; 438/294; 438/592
(58) Field of Classification Search ................ 257/369, 257/E27.062, E27.064, E21.636; 438/218, 438/294, 592
See application file for complete search history.

(56) References Cited

U.S. PATENT DOCUMENTS

| 5,633,523 | A  | * | 5/1997 | Kato | ........................... 257/369 |
| 2003/0141560 | A1 | * | 7/2003 | Sun  | ........................... 257/410 |

FOREIGN PATENT DOCUMENTS

| JP | 07-302844   | 11/1995 |
| JP | 2000-315789 | 11/2000 |
| JP | 2004-221226 | 8/2004  |

(Continued)

OTHER PUBLICATIONS

International Search Report mailed Jan. 16, 2007.

(Continued)

*Primary Examiner*—Tu-Tu V Ho
(74) *Attorney, Agent, or Firm*—Young & Thompson

(57) ABSTRACT

A semiconductor device includes first and second active regions on a semiconductor substrate, separated by an element isolation region; a line-shaped electrode disposed from over the first to over the second active region via the element isolation region; first and second FETs including a gate insulating film on the first and second active regions, respectively, a gate electrode composed of the line-shaped electrode and a source/drain region. Parts of the line-shaped electrode over the first and second active regions are formed of different materials. The line-shaped electrode includes a diffusion restraining region having thickness in a direction perpendicular to the substrate thinner than that over the first and second active regions. The diffusion restraining region is over the element isolation region and spans the whole width of the line-shaped electrode in the gate length direction.

17 Claims, 16 Drawing Sheets

FOREIGN PATENT DOCUMENTS

| | | |
|---|---|---|
| JP | 2005-129551 | 5/2005 |
| JP | 2005-167251 | 6/2005 |
| JP | 2005-228868 | 8/2005 |
| WO | 2006/001271 | 1/2006 |

OTHER PUBLICATIONS

"Demonstration of Fully Ni-Silicided Metal Gates on HfO2 Baed High-K Gate Dielectrics as a Candidate for Low Power Applications", K.G. Anil, et al., 2004 Symposium on VLSI Technology, Digest of Technical Papers, pp. 190-191.

"Dual-Metal Gate CMOS with HfO2 Gate Dielectric", S. B. Samavedam et al., Motorola Digital DNA Laboratories, 2002 IEEE, pp. 433-436.

"Tunable Work Function Dual Metal Gate Technology for Bulk and Non-Bulk CMOS", JaeHoon Lee et al., Department of Electrical Engineering, 2002 IEEE, pp. 359-362.

"Dual Workfunction Ni-Silicide/HfSiON Gate Stacks by Phase-Controlled Full-Silicidationh (PC-FUSI) Technique for 45nm-node LSTP and LOP Devices", Kensuke Takahashi et al., System Devices Research Laboratories, NEC Corporation, 2004 IEEE, pp. 91-94.

* cited by examiner (j-1)   (j-2)

(k-1)   (k-2)

(l-1)   (l-1)

(a-1)　(a-2)

(b-1)　(b-2)

(c-1)　(c-2)

(d-1)　(d-2)

(e-1)　(e-2)

(f-1)　(f-2)

US 7,838,945 B2

SEMICONDUCTOR DEVICE AND MANUFACTURING METHOD THEREOF

TECHNICAL FIELD

The present invention relates to a semiconductor device and a manufacturing method thereof, and more particularly to a semiconductor device provided with MOS (metal oxide semiconductor) field effect transistors (MOSFETs) whose gate electrodes are formed of metal silicides, and a manufacturing method thereof.

BACKGROUND ART

In the recent development of CMOS (complementary MOS) devices for which smaller and smaller transistors are required, the deterioration of the driving current due to the depletion of gate electrodes is posing a problem. In view of this problem, a so-called metal gate technique by which metallic materials are used in place of the traditional polycrystalline silicon is being studied with a view to enhancing the driving capacity.

On the other hand, along with miniaturization of transistors an increase in the gate leak current due to the thinning of the gate insulating film is posing a problem. For this reason, a reduction in the gate leak current by increasing the physical film thickness by using a high dielectric constant material (high-k material) for the gate insulating film is being studied with a view to reducing the power consumption.

As the material for use in the metal gate electrode, pure metal, metal nitride or silicide material is considered, but in any case the material is required (1) that formation of the metal gate electrode should not give rise to deterioration of the gate insulating film and (2) the threshold voltages (Vth) of the N-type MOSFET and of the P-type MOSFET should permit setting to appropriate values.

In order to realize a Vth level of not more than ±0.5 eV for CMOS transistors, it is necessary to use for a gate electrode material of which the work function is not greater than the mid-gap of Si (4.6 eV), desirably not more than 4.4 eV, for N-type MOSFETs and one of which the work function is not smaller than the mid-gap (4.6 eV) of Si, desirably not less than 4.8 eV, for P-type MOSFETs.

As means of realizing these objectives, a method of controlling the Vth of transistors by separately using metals or alloys having different work functions optimal for the gate electrodes of N-type MOSFETs and P-type MOSFETs to form different gates (dual metal gate technique), is proposed.

For instance, it is stated in Non-Patent Document 1 (International electron devices meeting technical digest 2002, p. 359) that the work functions of Ta and Ru formed over $SiO_2$ are respectively 4.15 eV and 4.95 eV, and work function modulation by 0.8 eV is possible between these two electrodes.

However, since the dual metal gate technique described requires separate preparation of metal layers made up of different metals or alloys having different work functions over a substrate, the metal layer deposited on the gate insulating film of either the P-type MOSFET or the N-type MOSFET has to be etched off and, as this invites deterioration of the quality of the gate insulating film in the etching process, accordingly there is a problem of adversely affecting the characteristics and reliability of elements.

On the other hand, there is proposed a technique regarding a silicide electrode obtained by fully siliciding a polycrystalline silicon electrode pattern with Ni. This technique permits silicidation of the polycrystalline silicon electrode pattern by a salicidation process after high temperature heat treatment to activate impurities in the source/drain region of CMOS. For this reason, it is highly compatible with conventional CMOS processes and, because the film stacked over the gate insulating film need not be removed by etching unlike the dual metal gate technique, damage to the gate insulating film can be suppressed.

In particular Non-Patent Document 2 (International electron devices meeting technical digest 2004, p. 91) discloses that the effective work function can be controlled in a wide range of transistors, in a MOSFET using a HfSiON high dielectric constant film as the gate insulating film and a fully silicided Ni silicide electrode as the gate electrode, by regulating the composition ratio of the Ni silicide by utilizing the formation of a crystalline phase. It is further stated that a Vth of ±0.3 V can be realized by utilizing the formation of an $Ni_3Si$ phase, an NiSi phase and an $NiSi_2$ phase.

However, even these techniques still involve the following problems which the dual metal gate technique has. Thus, the dual metal gate technique is susceptible, in a structure in which the gate electrode of the N-type MOSFET and the gate electrode of the P-type MOSFET are made up of one line of electrodes, to the diffusion of the constituent materials on the interface between the two gate electrodes. When this diffusion proceeds to a considerable degree, the composition of materials varies to make impossible to obtain the designed work function and makes the characteristics of operation difficult to control. Although Patent Document 1 (Japanese Patent Application Laid Open No. 2004-221226) describes a method intended to solve this problem, a superior diffusion preventive technique is called for.

DISCLOSURE OF THE INVENTION

An object of the present invention is to provide, in view of the problems noted above, a semiconductor device excelling in performance and reliability and a manufacturing method thereof.

According to the invention the following semiconductor devices and manufacturing methods thereof are provided.

(1) A semiconductor device comprising:
 a semiconductor substrate;
 an element isolation region on the semiconductor substrate;
 a first active region and a second active region disposed on the semiconductor substrate and separated from each other by the element isolation region;
 a line-shaped electrode disposed from over the first active region to over the second active region via the element isolation region;
 a first field effect transistor comprising a first gate insulating film on the first active region, a first gate electrode composed of the line-shaped electrode on the first gate insulating film, and a first source/drain region in the first active region; and
 a second field effect transistor comprising a second gate insulating film over the second active region, a second gate electrode composed of the line-shaped electrode on the second gate insulating film, and a second source/drain region in the second active region,
 wherein part of the line-shaped electrode over the first active region and part of the line-shaped electrode over the second active region are formed of mutually different materials; and
 the line-shaped electrode comprises a diffusion restraining region having thickness T of the line-shaped electrode in a direction perpendicular to the substrate thinner than thickness T of the line-shaped electrode over the first and second active regions, the diffusion restraining region being provided over the element isolation region and spanning the whole width of the line-shaped electrode in the gate length direction.

(2) The semiconductor device according to item (1) or (2), wherein Tr/Tg1<0.4 and Tr/Tg2<0.4 are satisfied where Tr represents the thickness of the line-shaped electrode in the diffusion restraining region, Tg1, the thickness of the line-shaped electrode over the first active region, and Tg2, the thickness of the line-shaped electrode over second active region.

(3) The semiconductor device according to item (1) or (2), wherein thickness Tr of the line-shaped electrode in the diffusion restraining region is not less than 10 nm but not more than 30 nm.

(4) The semiconductor device according to any one of items (1) to (3), wherein the width of the diffusion restraining region in a direction perpendicular to the gate length direction is not less than 10 nm but not more than 30 nm.

(5) The semiconductor device according to any one of items (1) to (4), wherein the first and second gate insulating films include high dielectric constant insulating films, and
the line-shaped electrode over the first and second active regions are formed of a silicide.

(6) The semiconductor device according to item (5), wherein the first and second gate insulating films include high dielectric constant insulating films,
the part of the line-shaped electrode over an N-type active region being the first active region is formed of a silicide having a composition represented by $Ni_xSi_{1-x}(0.55 \leq x<1)$, and
the part of the line-shaped electrode over a P-type active region being the second active region is formed of a silicide having a composition represented by $Ni_xSi_{1-x}(0<x<0.55)$.

(7) The semiconductor device according to item (6), wherein the part of the line-shaped electrode over the first active region is formed of a silicide whose main component is an $Ni_3Si$ phase, and the part of the line-shaped electrode over the second active region is formed of a silicide whose main component is an NiSi phase or an $NiSi_2$ phase.

(8) The semiconductor device according to any one of items (1) to (4), wherein the first and second gate insulating films include high dielectric constant insulating films,
the part of the line-shaped electrode over an N-type active region being the first active region is formed of a silicide, and
the part of the line-shaped electrode over a P-type active region being the second active region is formed of polycrystalline silicon at least in the lower part thereof in contact with the gate insulating film at least.

(9) The semiconductor device according to any one of items (1) to (8), wherein the first field effect transistor and the second field effect transistor make up CMOS.

(10) The semiconductor device according to any one of items (1) to (4), wherein the part of the line-shaped electrode over an N-type active region being the first active region is formed of polycrystalline silicon at least in the lower part thereof in contact with the gate insulating film at least,
the second gate insulating film includes a high dielectric constant insulating film, and
the part of the line-shaped electrode over a P-type active region being the second active region is formed of a silicide.

(11) The semiconductor device according to item (10), wherein the second field effect transistor over the second active region makes up a transistor in a DRAM cell region, and the first field effect transistor in the first active region makes up a transistor in another region.

(12) The semiconductor device according to any one of items (5) to (11), wherein the gate insulating film including the high dielectric constant insulating film has a stacked structure comprising a silicon oxide film or silicon oxynitride film and the high dielectric constant insulating film in contact with the gate electrode.

(13) The semiconductor device according to any one of items (5) to (12), wherein the high dielectric constant insulating film contains hafnium,

(14) A method of manufacturing the semiconductor device described in item (1), comprising:
preparing a semiconductor substrate including an element isolation region, a first active region and a second active region, the regions being separated from each other by the element isolation region;
forming an insulating film for a gate insulating film on the semiconductor substrate;
forming a first polycrystalline silicon film over the insulating film;
forming a groove in the first polycrystalline silicon film over the element isolation region, the groove reaching the element isolation region or the insulating film and spanning the whole width in the gate length direction of a line-shaped electrode to be formed afterwards; forming a second polycrystalline silicon film thinner than the first polycrystalline silicon film so as to cover the whole bottom face of the groove;
forming an insulating film for masking use over the second polycrystalline silicon film so as to fill the groove;
forming a gate pattern by processing the insulating film for masking use and the first and second polycrystalline silicon films;
forming source/drain regions in the first and second active regions;
forming an interlayer insulating film so as to embed the gate pattern;
removing the interlayer insulating film until the insulating film for masking use is exposed, followed by removing the insulating film for masking use to expose the polycrystalline silicon film;
forming a metal for siliciding use all over, and conducting heat treatment such that the first and second polycrystalline silicon films are silicided to form a first silicide; and
forming a mask to cover one active region and the groove, forming a metal of the same type as the aforementioned metal all over, and conducting heat treatment such that a second silicide differing from the first silicide in compositional ratio is formed over the other active region to obtain a line-shaped electrode comprising a part of the first silicide and a part of the second silicide.

(15) A method of manufacturing the semiconductor device described in item (1), comprising:
preparing a semiconductor substrate including an element isolation region, a first active region and a second active region, the regions being separated from each other by this element isolation region;
forming an insulating film for a gate insulating film on the semiconductor substrate;
forming a first polycrystalline silicon film over the insulating film;
forming a groove in the first polycrystalline silicon film over the element isolation region, the groove reaching the element isolation region or the insulating film and spanning the whole width in the gate length direction of a line-shaped electrode to be formed afterwards;
forming a second polycrystalline silicon film thinner than the first polycrystalline silicon film so as to cover the whole bottom face of the groove;

forming an insulating film for masking use over the second polycrystalline silicon film so as to fill the groove;

removing the insulating film for masking use in other region than a region including one active region and the groove;

forming a gate pattern by processing the first and second polycrystalline silicon films in a region where the insulating film for masking use is removed and by processing the insulating film for masking use and the first and second polycrystalline silicon films in a region where the same is not removed;

forming source/drain regions in the first and second active regions;

forming silicide layers over the source/drain regions by the salicidation technique and, at the same time, forming a silicide layer on the gate pattern in the region where the insulating film for masking use is removed;

forming an interlayer insulating film so as to embed the gate pattern; removing the interlayer insulating film until the insulating film for masking use is exposed, followed by removing the insulating film for masking use to expose the second polycrystalline silicon film; and forming a mask to cover the groove and the active region on the side where the silicide layer is formed, forming a metal for siliciding use all over, and conducting heat treatment such that the second polycrystalline silicon in contact with the metal and the first polycrystalline silicon underneath are silicided to obtain a line-shaped electrode comprising a part of the silicide obtained by this silicidation and a part of the polycrystalline silicon over which the silicide layer is formed.

(16) A method of manufacturing the semiconductor device described in item (1), comprising:

preparing a semiconductor substrate including an element isolation region, a first active region and a second active region, the regions being separated from each other by the element isolation region;

forming a first insulating film over at least one active region;

forming a first polycrystalline silicon film all over;

forming a first mask over the first polycrystalline silicon film at least over the one active region, and removing the first polycrystalline silicon over the region where the first mask is not formed to expose the surface of the other active region;

forming a second insulating film all over;

forming a second polycrystalline silicon film all over;

forming a second mask over the second polycrystalline silicon film over the other active region, and removing the second polycrystalline silicon film and the second insulating film in the region not covered by the masks by using the second mask and first mask to form a groove over the element isolation region, the groove reaching the element isolation region and spanning the whole width in the gate length direction of a line-shaped electrode to be formed afterwards; forming a third polycrystalline silicon film thinner than the first and second polycrystalline silicon films so as to cover the whole bottom face of the groove;

forming an insulating film for masking use over the third polycrystalline silicon film so as to fill the groove;

removing the insulating film for masking use in other region than a region including the other active region and the groove;

forming a gate pattern by processing the first and third polycrystalline silicon films in a region where the insulating film for masking use is removed and by processing the insulating film for masking use and the second and third polycrystalline silicon films in a region where the same is not removed;

forming source/drain regions over the first and second active regions;

forming silicide layers over the source/drain regions by the salicidation technique and, at the same time, forming a silicide layer on the gate pattern in the region where the insulating film for masking use is removed;

forming an interlayer insulating film so as to embed the gate pattern;

removing the interlayer insulating film until the insulating film for masking use is exposed, followed by removing the insulating film for masking use to expose the polycrystalline silicon film; and forming a mask to cover the groove and the active region on the side where the silicide layer is formed, forming a metal for siliciding use all over, and conducting heat treatment such that the third polycrystalline silicon in contact with the metal and the second polycrystalline silicon underneath are silicided to obtain a line-shaped electrode comprising a part of the silicide obtained by this silicidation and a part of the polycrystalline silicon over which the silicide layer is formed.

(17) The method of manufacturing semiconductor device according to item (15) or (16), further comprising:

removing the insulating film in the groove after forming the source/drain regions, wherein a surface layer of the polycrystalline silicon in the groove is silicided in the step of forming a silicide layer over the gate pattern.

In the context of this specification, the "effective work function" of the gate electrode is generally figured out from a flat band voltage by CV measurement, and is affected by such factors as the fixed electric charge in the insulating film, the dipole formed on the interface and the fermi level pinning in addition to the intrinsic work function of the gate electrode. It is distinguished from the intrinsic "work function" of the material of the gate electrode.

Further in this specification, "MOS" (Metal Oxide Semiconductor) means a stacked structure of conductor, insulator and semiconductor, but not limited to one in which the conductor is a simple metal and the insulator is silicon dioxide.

According to the invention, a high performance semiconductor device excelling in reliability and a manufacturing method thereof can be provided.

BEST MODE FOR CARRYING OUT THE INVENTION

The present invention is suitable for a semiconductor device provided with field effect transistors (hereinafter "FETs") differing in one another in threshold voltage, wherein these FETs share a one-line electrode (hereinafter "line-shaped electrode") as the gate electrode of each. It is particularly suitable for a semiconductor device provided with a P-channel type FET (hereinafter "PMOS") and an N-channel type FET (hereinafter "NMOS"), wherein these FETs share the line-shaped electrode as the gate electrode of each. Such a semiconductor device has gate electrodes formed of different materials (materials of different types or different composition ratios) between the FETs, that is, the device has a line-shaped electrode having a part made up of a gate material of one FET and a part made up of another gate material, different from this material of the other FET. The interface region of these gate parts is arranged over an element isolation region. By using for the gate electrodes materials of different types or of different composition ratios not similar in work function, FETs having mutually different threshold voltages can be formed.

Figure 1A:
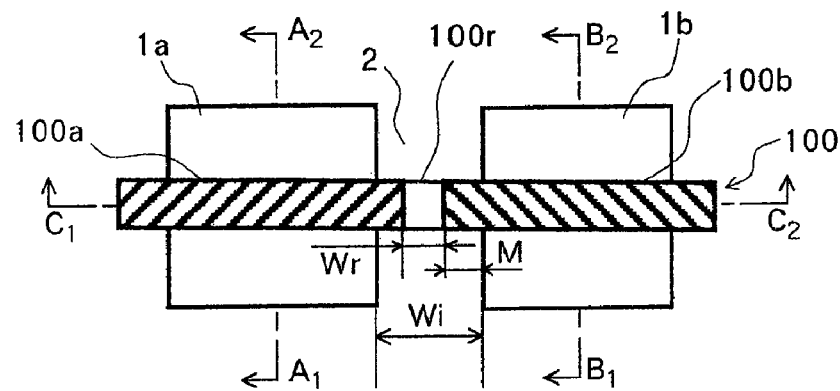
FIG. 1a is a plan illustrating the structure of a semiconductor device according to the invention.
Figure 1B:
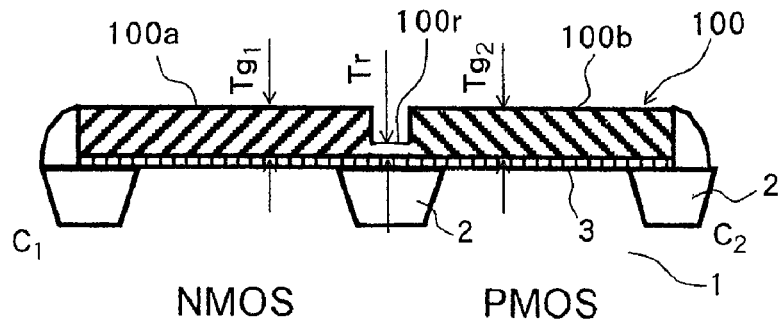
FIG. 1b is a section illustrating the structure of the semiconductor device according to the invention.
Figure 1C:
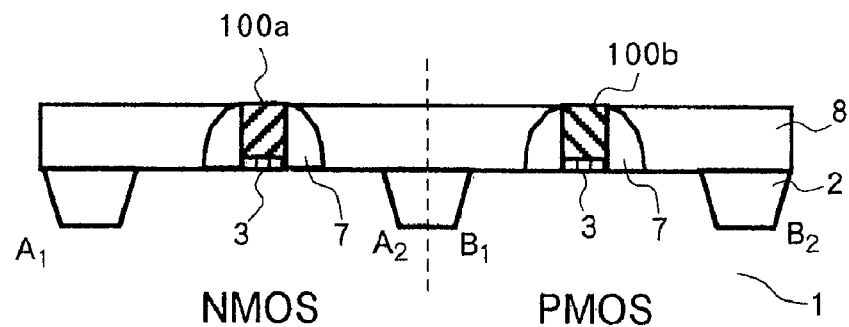
FIG. 1c is a section illustrating the structure of the semiconductor device according to the invention.

FIG. 1a, FIG. 1b and FIG. 1c show a schematic configuration of a semiconductor device pertaining to one exemplary embodiment of the present invention. FIG. 1a shows a plan, FIG. 1b, a section along line C1-C2 in FIG. 1a, and FIG. 1c, a section along lines A1-A2 and B1-B1 in FIG. 1a. Reference numeral 1 in the drawings designates a silicon substrate, 1a, a P-type active region, 1b, an N-type active region, 2, an element isolation region, 3, a gate insulating film, 7, a gate side wall, 8, an interlayer insulating film, 100, line-shaped electrodes, 100a and 100b, gate electrodes, and 100r, a diffusion restraining region. Illustration of the source/drain region is dispensed with.

As these drawings illustrate, line-shaped electrode 100 is disposed from over P-type active region 1a to over N-type active region 1b via element isolation region 2, and has thin diffusion restraining region 10r over element isolation region 2. The part of the line-shaped electrode 100 over P-type active region 1a constitutes gate electrode 100a of an NMOS and the part over the N-type active region 1b constitutes gate electrode 100b of a PMOS. These gate electrodes are formed of materials of different types or of different composition ratios not similar in work function, and the NMOS and PMOS are controlled to mutually different threshold voltages.

Since the thin diffusion restraining region is provided in the interface part between the gate electrodes formed of mutually different materials according to the invention, the diffusion of the gate materials in this interface part can be held within the element isolation region with the result that a high performance semiconductor device controlled to a desired threshold voltage can be provided.

The diffusion restraining region which is a major characteristic of the invention is a region of which the thickness Tr in a direction perpendicular to the substrate is smaller than thickness Tg1 of the line-shaped electrode over the P-type active region (the gate electrode 100a of the NMOS) and thickness Tg2 of the line-shaped electrode over the N-type active region (gate electrode 100b of the PMOS) and, from the viewpoint of achieving a sufficient diffusing restraining effect, it is preferable for the thicknesses to satisfy the condition of Tr/Tg1<0.4 and Tr/Tg2<0.4. From the viewpoint of securing the accuracy of film formation and electroconductivity, it is preferable for thickness Tr to be not less than 10 nm, more preferably not less than 15 nm. From the viewpoint of a more sufficient diffusing restraining effect, it is preferable for thickness Tr to be not more than 30 nm, more preferably not more than 25 nm.

It is preferable for width Wr of the diffusion restraining region having thickness Tr stated above in a direction perpendicular to the direction of gate length (the direction of line C1-C2) to be not less than 10 nm, more preferably not less than 15 nm from the viewpoint achieving a sufficient diffusing restraining effect. For width Wr, it is preferable to be not more than 30 nm, more preferably not more than 25 nm from the viewpoint of securing electroconductivity and increasing the density.

It is preferable for the diffusion restraining region to be so arranged that the part of the gate material on one active region side which bulges out of the diffusion restraining region toward the other active region stays over the element isolation region in the process of fabricating the line-shaped electrodes. Although the arrangement of the diffusion restraining region can be set as appropriate according to the level of the diffusion restraining effect of the diffusion restraining region, it is preferable from the viewpoint stated above to set the interval (margin) M between an end of the diffusion restraining region in a direction perpendicular to the direction of gate length and an end of the element isolation region to be at least 30 nm, more preferably not less than 40 nm. Where the gate material bulges out from one active region side toward the other active region, it is preferable to set margin M on the bulging-out side within the extent stated above, and margin M on the other side can be set as appropriate according to the accuracy of alignment at the time of fabrication. Where both gate materials mutually diffuse and bulge out of both sides of the diffusion restraining region, resulting in the formation of mixed regions of both gate materials on both sides of the diffusion restraining region, it is preferable to set margins M on both sides of the diffusion restraining region within the extent stated above. It is preferable for these margins M to be not more than 100 nm, more preferably not more than 80 nm, particularly preferably not more than 70 nm, from the viewpoint of increasing the density by reducing width Wi in a direction perpendicular to the direction of gate length of the element isolation region.

Figure 2A:
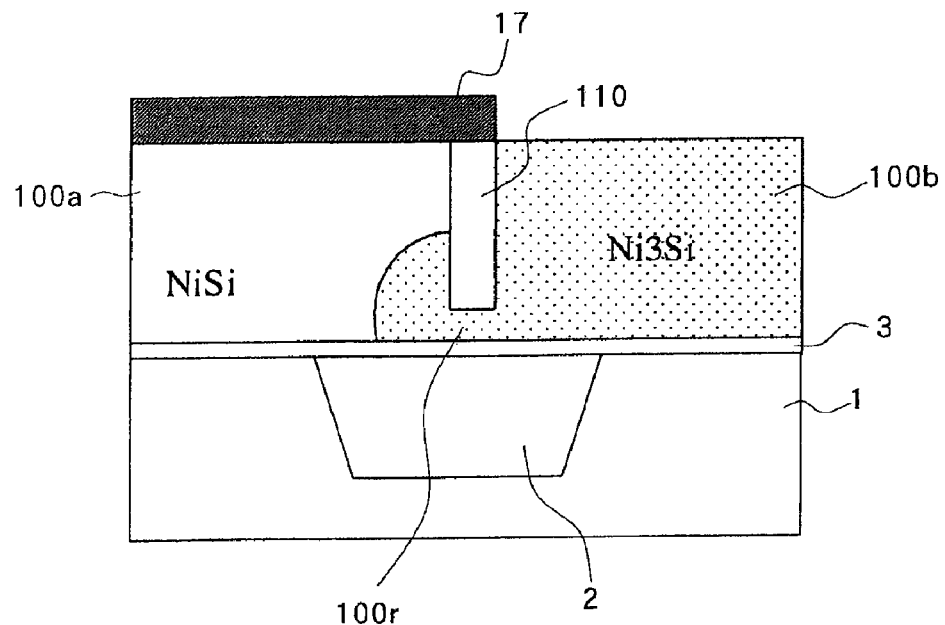
FIG. 2a is a schematic partial section illustrating the effect of the invention.
Figure 2B:
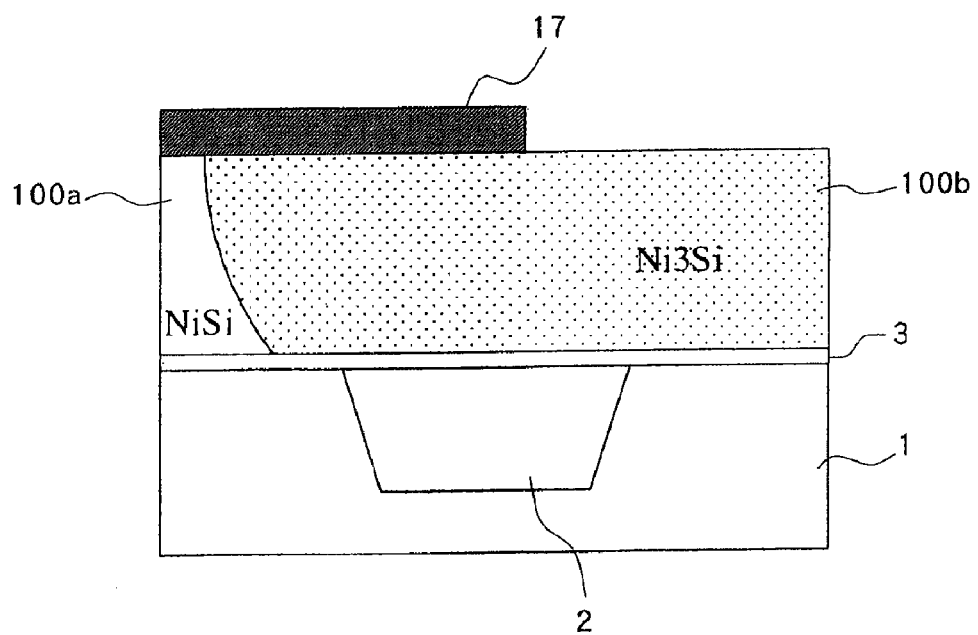
FIG. 2b is a schematic partial section illustrating the problems with the related art.

FIG. 2a and FIG. 2b show schematic partial sections along line C1-C2 of element structures using NiSi and Ni$_3$Si as gate materials according to the invention and according to the related art, respectively. Each of these drawings illustrates a state in which Ni$_3$Si on the PMOS region side has bulged out into NiSi on the NMOS region side at its formation step (the silicidation step to be described afterwards). In the drawings, reference numeral 110 designates an insulating part, and 17, a mask.

By providing the diffusion restraining region, the width of bulging out from one region side to the other is reduced and, as shown in FIG. 2a, the bulging-out part can be kept within the element isolation region. On the other hand, if no diffusion restraining region is provided, Ni$_3$Si on the PMOS region side will diffuse over and infiltrate into the NMOS region as shown in FIG. 2b, inviting a change in the threshold of the NMOS and making it impossible to obtain prescribed performance characteristics.

The invention described above is suitable for the following device structures for instance.

(a) A form in which the gate insulating film of the PMOS and the gate insulating film of the NMOS include high dielectric constant insulating films and the gate electrode of the PMOS and the gate electrode of the NMOS are formed of silicides. In this case, the silicide of the gate electrode of the PMOS and the silicide of the gate electrode of the NMOS are made up of different materials or materials of similar elements different in composition ratios (b) A form in which the gate insulating film of the PMOS and the gate insulating film of the NMOS include high dielectric constant insulating films, the gate electrode of the PMOS is formed of a silicide, and the gate electrode of the NMOS is formed of polycrystalline silicon. In this case, there may as well be a silicide layer over the polycrystalline silicon layer of the gate electrode of the NMOS. The gate electrode of this NMOS may as well have a noncrystalline silicon layer (amorphous silicon layer) as the base layer for the polycrystalline silicon layer.

(c) A form in which the gate insulating film of the PMOS is made up of a silicon oxide film or a silicon oxynitride film or a stacked film thereof, the gate electrode of the PMOS is formed of polycrystalline silicon and the gate electrode of the NMOS preferably includes a high dielectric constant insulating film, and the gate electrode of the NMOS is formed of a silicide. In this case, there may as well be a silicide layer over the polycrystalline silicon layer of the gate electrode of the PMOS. The gate electrode of this PMOS may as well have a noncrystalline silicon layer (amorphous silicon layer) as the base layer for the polycrystalline silicon layer.

Forms (a) and (b) described above are particularly suitable for the CMOS structure. Form (c) is particularly suitable for a structure in which the NMOS makes up the FET of a DRAM cell region and the PMOS makes up an FET of another region, for instance the FET of a circuit peripheral to a DRAM or the FET of a logic circuit.

For use as the gate insulating film according to the invention, a silicon oxide film, a silicon oxynitride film, a stacked film of a silicon oxide film and a silicon oxynitride film, a high dielectric constant insulating film, or a stacked film comprising a silicon oxide film or a silicon oxynitride film and a high dielectric constant insulating film over the same can be cited. From the viewpoints of reducing the power consumption during standby by restraining a leak current, enhancing the reliability by securing a sufficient physical film thickness and controlling the threshold voltage through combination with a silicide electrode, it is preferable to use for at least one of the FETs a high dielectric constant insulating film or a stacked film including the same.

The high dielectric constant insulating film is made up of a material having a relative dielectric constant greater than the relative dielectric constant of silicon dioxide ($SiO_2$) (3.9), and such a material may be a metal oxide, a metal silicate, a metal oxide into which nitrogen is introduced or a metal silicate into which nitrogen is introduced. Introduction of nitrogen is preferable because it suppresses crystallization and enhances reliability. As the metallic element to be contained in the high dielectric constant material, it is preferable to use hafnium (Hf) or zirconium (Zr), especially Hf, from the viewpoint of the heat resistance of the film and of suppressing the fixed electric charge in the film. As such a high dielectric constant material a metal oxide containing Hf or Zr and Si, or a metal oxynitride containing this metal oxide and further nitrogen, is preferable, and HfSiO or HfSiON is more preferable, especially HfSiON.

It is preferable for the high dielectric constant insulating film to be disposed in contact with the gate electrode. The combination of the gate electrode and the high dielectric constant insulating film in contact with the same enables the threshold voltage of the transistor to be controlled in a broad range. In this case, a silicon oxide film or a silicon oxynitride film may as well be disposed on the interface between the high dielectric constant insulating film and the silicon substrate to reduce the interface state between the silicon substrate and the gate insulating film and thereby to alleviate the influence of the fixed charge in the high dielectric constant insulating film.

It is preferable that the atomic percentage Mi/(Mi+Si) of the metallic element Mi (e.g. Hf) relative to Si in the high dielectric constant insulating film is not less than 0.3 but not more than 0.7. If this percentage is not less than 0.3, the leak current flowing in the high dielectric constant insulating film at the time of device operation can be effectively suppressed to sufficiently reduce power consumption. On the other hand, if this percentage is not more than 0.7, the heat resistance of the high dielectric constant insulating film can be secured, and the crystallization of the high dielectric constant insulating film during the device fabrication process can be suppressed to thereby restrain performance deterioration of the same as a gate insulating film.

It is preferable, from the viewpoints of controlling the threshold voltage and enhancing electroconductivity, for the gate electrode of at least one of the FETs in the semiconductor device according to the invention to be formed of a silicide. From the viewpoint of preventing depletion in the gate electrode and enhancing the driving performance, it is preferable for the whole including the region in contact with the gate insulating film to be formed of a silicide.

As the metal of the silicide making up the gate electrode, a metal that can form a silicide by the salicidation technique can be used, such as nickel (Ni), platinum (Pt), palladium (Pd), cobalt (Co) or vanadium (V). Of these metals, Ni is preferable. Ni permits complete silicidation of the whole gate electrode at a relatively low temperature (in a range of 350 to 500° C.). Therefore, the increase in the resistance of the metal silicide formed in the contact area of the source/drain region can be suppressed. Also, in this temperature range, Ni can form both a crystalline phase of a high Si concentration and a crystalline phase of a high Ni concentration. Furthermore, the composition is determined in a self-aligning way in the silicidation for the formation of the gate electrode, and the composition is stable, making it possible for the process to be restrained in fluctuations.

It is preferable for nickel silicide, which is a suitable silicide for making up the gate electrode, to have a composition represented by $Ni_xSi_{1-x}$ ($0.55 \leq x < 1$) in the PMOS in the CMOS, more preferable to satisfy the condition of $0.6<x<0.8$, and particularly preferable to satisfy the condition of $0.7<x<0.8$. In the NMOS in the CMOS on the other hand, it is preferable for nickel silicide to have a composition represented by $Ni_xSi_{1-x}$ ($0<x<0.55$), more preferable to satisfy the condition of $0.3<x<0.55$, and particularly preferable to satisfy the condition of $0.3<x<0.35$ or $0.45<x<0.55$. Thus, it is preferable for the silicide of the PMOS to have an $Ni_3Si$ phase as its main component and preferable for the silicide of the NMOS to have an NiSi phase or an $NiSi_2$ phase as its main component. The crystalline phase of the nickel silicide is mainly classified into $NiSi_2$, NiSi, $Ni_3Si_2$, $Ni_2Si$ and $Ni_3Si$, and mixtures of these silicides can as well be formed. In particular, the compositions of the $Ni_3Si$ phase, the NiSi phase and the $NiSi_2$ phase are determined in a self-aligning way, easily formed and stable, making it possible for the process to be restrained in fluctuations. Since the effective work function of the nickel silicide over the HfSiON film is about 4.8 eV for $Ni_3Si$, about 4.5 eV for NiSi and about 4.4 eV for $NiS_2$, it is preferable to apply $Ni_3Si$ to the PMOS and NiSi or $NiSi_2$ to the NMOS. The compositions of the nickel silicides are not limited to the CMOS structure described above, but can be appropriately set according to the desired transistor characteristics.

The present invention is suitable for a semiconductor device of which the height of the gate electrode (the thickness in a direction perpendicular to the substrate) is not more than 200 nm, preferably not more than 150 nm. On the other hand, from the viewpoint of securing adequate operating performance, it is preferable for the height of the gate electrode to be not less than 80 nm, more preferably not less than 100 nm. The gate length can be set in a range of, for instance, 10 to 100 nm.

Next, exemplary embodiments of the manufacturing method according to the invention will be described with reference to drawings.

EXAMPLE OF FABRICATION 1

Figure 3A:
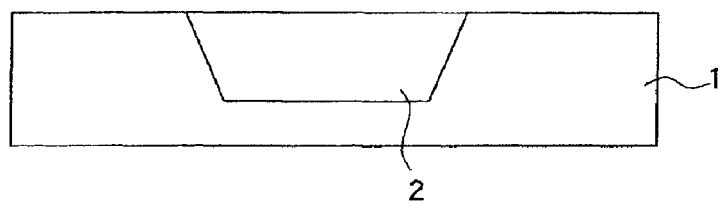
FIG. 3a is a process sectional view illustrating a manufacturing method of the semiconductor device according to the invention.

A first example of fabrication by the manufacturing method according to the invention will be described with reference to FIG. 3a through FIG. 3v. FIG. 3a through FIG. 3f, (g-1) of FIG. 3g through (v-1) of FIG. 3v correspond to the section along line C1-C2 in FIG. 1a, and (g-2) of FIG. 3g through (v-2) of FIG. 3v correspond to the section along line B1-B2 in FIG. 1a.

First, semiconductor substrate 1 having element isolation region 2 formed by the STI (Shallow Trench Isolation) technique, a P-type active region and an N-type active region are made ready (FIG. 3a).

Next, gate insulating film 3 is formed over the surface of the silicon substrate, in which the element isolation region is formed. The gate insulating film in this exemplary embodiment is formed of a silicon oxide film and an HfSiON film. This HfSiON film is a region in which the Hf concentration varies in the depthwise direction (a direction perpendicular to the substrate) in the gate insulating film, wherein the Hf concentration is the highest in the vicinities of the interface between the gate electrode and the gate insulating film, lowers toward the silicon substrate and the average Hf atomic percentage Hf/(Hf+Si) in the HfSiON film is 0.5. The silicon oxide film is a region of a thermally oxidized silicon film ($SiO_2$ film) near the interface between the silicon substrate and the gate insulating film in the gate insulating film. Such a gate insulating film can be formed in the following way. First, a thermally oxidized silicon film of 2 nm in thickness is formed, and then a hafnium (Hf) film of 0.5 nm in thickness is deposited by long throw sputtering. Next, an HfSiO film is formed by so subjecting to solid phase diffusion the Hf into the base thermally oxidized silicon film as to leave an $SiO_2$ film in the region in contact with the silicon substrate by conducting two-stage heat treatments first for 1 minute at 500° C. in oxygen and then for 30 seconds at 800° C. in nitrogen. After that, an HfSiON film of 2 nm in thickness is obtained by nitriding annealing for 10 minutes at 900° C. in an $NH_3$ atmosphere.

Figure 3B:
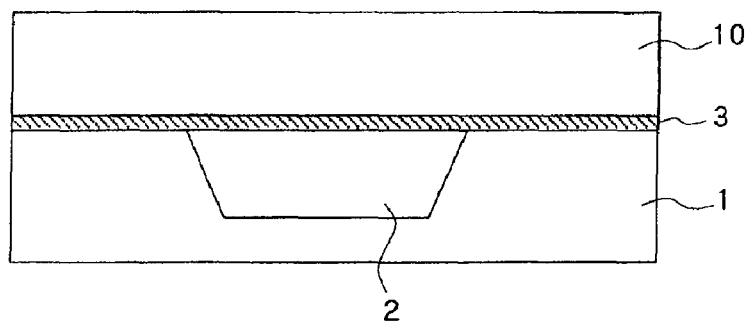
FIG. 3b is a process sectional view illustrating the manufacturing method of the semiconductor device according to the invention.

Next, polycrystalline silicon film 10 of 80 nm in thickness is deposited over the gate insulating film by CVD (Chemical Vapor Deposition) (FIG. 3b).

Figure 3C:
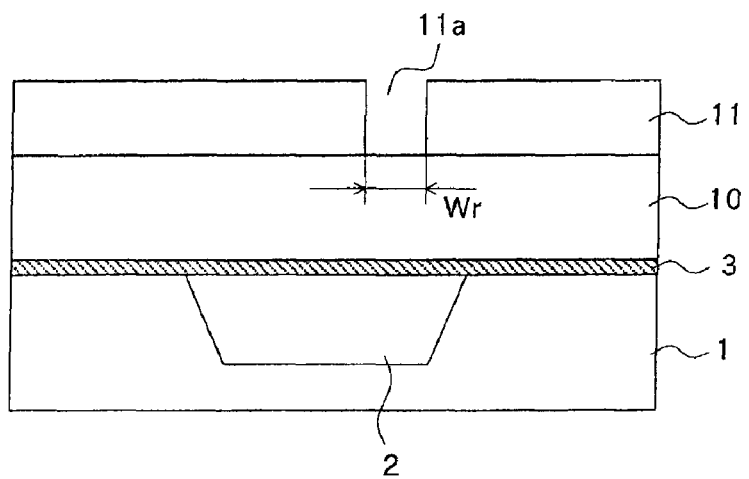
FIG. 3c is a process sectional view illustrating the manufacturing method of the semiconductor device according to the invention.

Next, resist mask 11 having aperture 11a matching the size of a prescribed diffusion restraining region size is formed by lithography technique (FIG. 3c). Here, aperture width Wr in a direction perpendicular to the gate length direction is set to 20 nm.

Figure 3D:
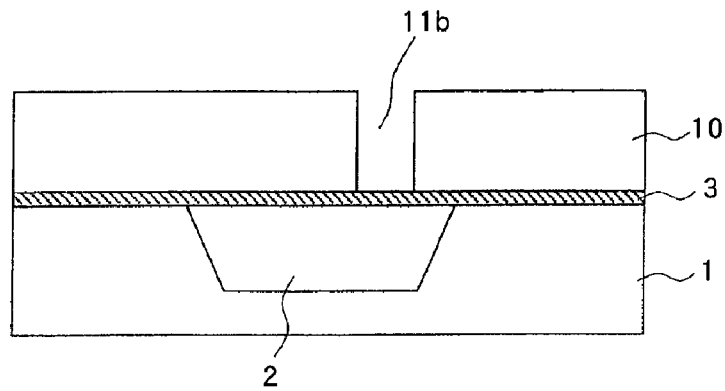
FIG. 3d is a process sectional view illustrating the manufacturing method of the semiconductor device according to the invention.

Next, groove 11b reaching the insulating part (the gate insulating film or the element isolation region) in a lower layer is formed in polycrystalline silicon film 10 by Reactive Ion Etching (RIE) using resist mask 11 (FIG. 3d). This groove 11b has a size matching the planar size of a prescribed diffusion restraining region.

Figure 3E:
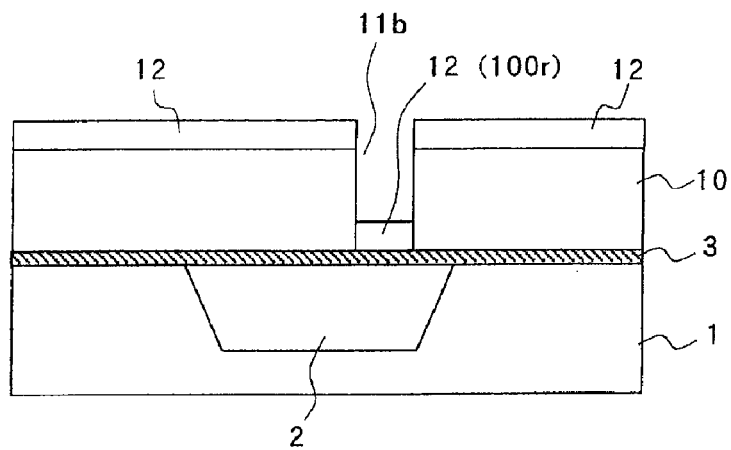
FIG. 3e is a process sectional view illustrating the manufacturing method of the semiconductor device according to the invention.

Then, thin polycrystalline silicon film 12 is so formed to a thickness of 20 nm by, for instance, sputtering as to completely cover the insulating part exposed on the bottom face of this groove 11b (FIG. 3e). It is desirable then to perform this step under a condition to prevent a polycrystalline silicon film from being formed on the side wall within the groove as far as practicable. If any polycrystalline silicon film is formed on the side wall, the groove having a size which takes into account the thickness of the film is to be formed. The thin polycrystalline silicon film formed on the bottom of groove 11b constitutes diffusion restraining region 100r.

Figure 3F:
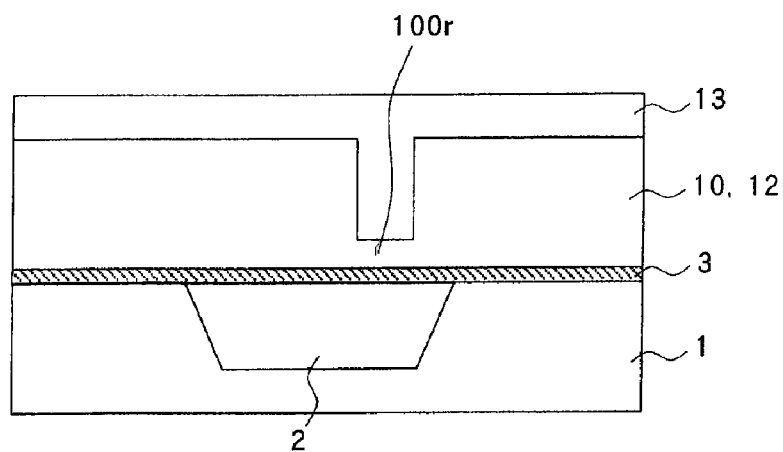
FIG. 3f is a process sectional view illustrating the manufacturing method of the semiconductor device according to the invention.

Next, a hard mask 13 made up of an oxide film is so formed over polycrystalline silicon films 10 and 12 as to fill groove 11b (FIG. 3f).

Figure 3G:
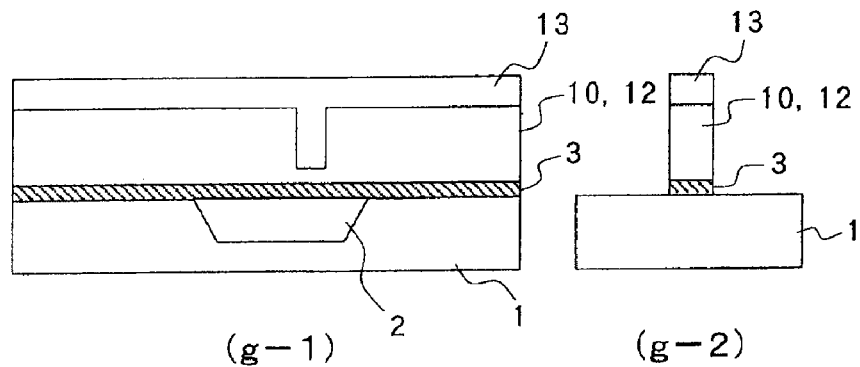
FIG. 3g is a process sectional view illustrating the manufacturing method of the semiconductor device according to the invention.

Next, the stacked films over the silicon substrate (gate insulating film 3, polycrystalline silicon films 10 and 12, and hard mask 13) are processed into a gate pattern by the lithography technique and RIE (Reactive Ion Etching) technique (FIG. 3g).

Figure 3H:
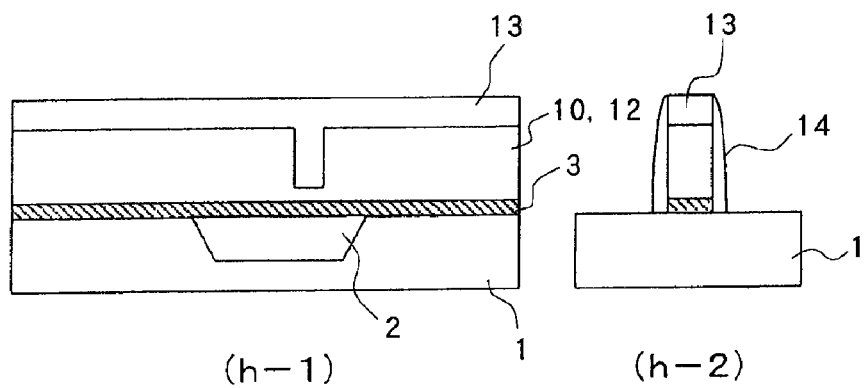
FIG. 3h is a process sectional view illustrating the manufacturing method of the semiconductor device according to the invention.

Then, a thin silicon oxide film is so deposited as to cover the gate pattern by CVD, followed by formation of spacer 14 by etching back (FIG. 3h).

Figure 3I:
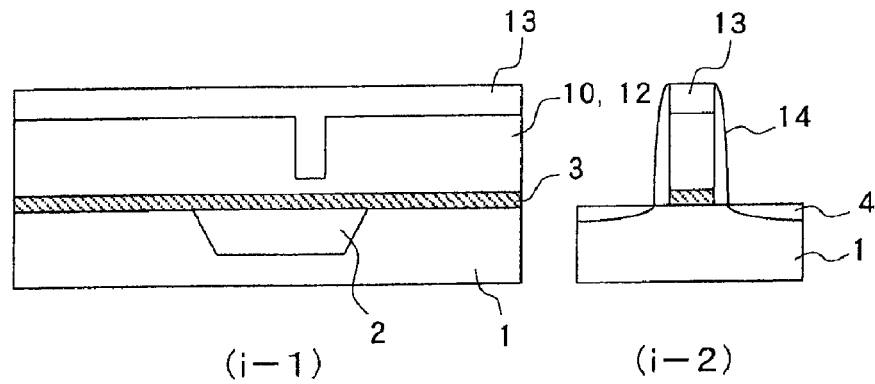
FIG. 3i is a process sectional view illustrating the manufacturing method of the semiconductor device according to the invention.

Next, ion implantation is carried out masked with the gate pattern and the spacer to form extended diffusion region 4 in a self-aligning way (FIG. 3i).

Figure 3J:
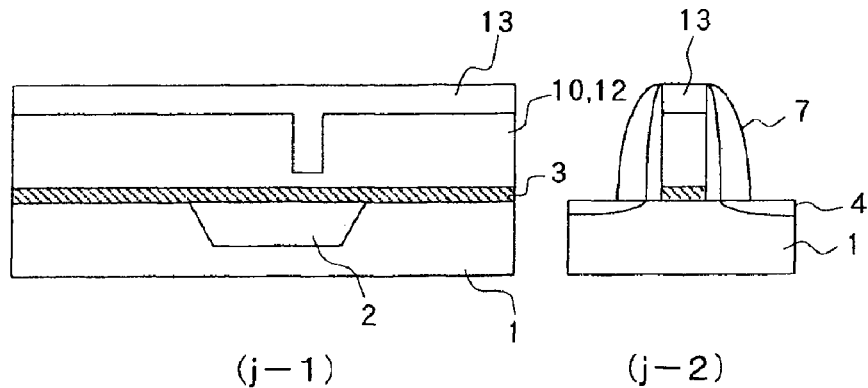
FIG. 3j is a process sectional view illustrating the manufacturing method of the semiconductor device according to the invention.

Then, a silicon oxide film is so deposited as to cover the gate pattern and the spacer by CVD, followed by formation of gate side wall 7 by etching back (FIG. 3j).

Figure 3K:
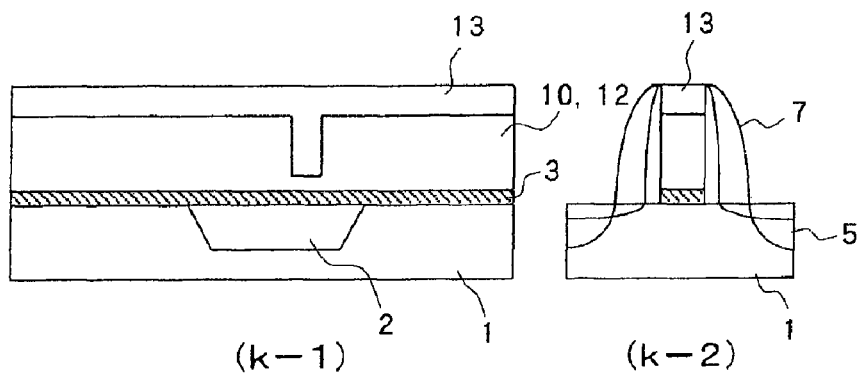
FIG. 3k is a process sectional view illustrating the manufacturing method of the semiconductor device according to the invention.

Next, ion implantation is carried out again, followed by activating annealing to form source/drain diffusion region 5 (FIG. 3k).

Figure 3L:
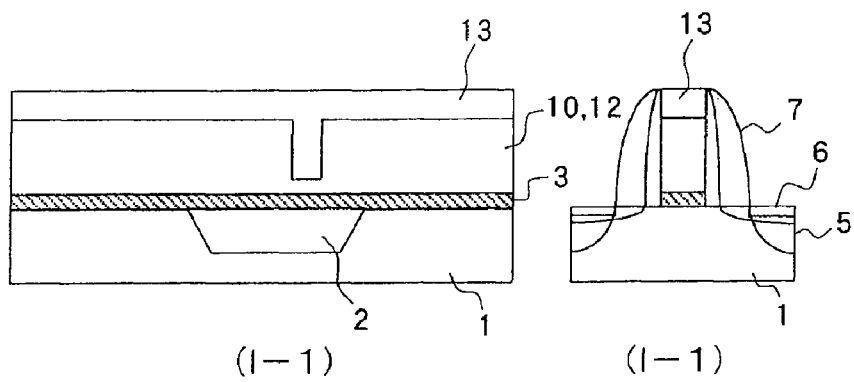
FIG. 3l is a process sectional view illustrating the manufacturing method of the semiconductor device according to the invention.

Then, a nickel film (Ni film) is deposited all over by sputtering, followed by the formation of nickel silicide layer 6 only over the source/drain diffusion region by the salicidation technique masked with the gate pattern, the gate side wall and the element isolation region (FIG. 3l). In this exemplary embodiment, a nickel monosilicide (NiSi) layer which can keep the contact resistance to the minimum is formed as this nickel silicide layer 6. Instead of this NiSi layer, a Co silicide layer or a Ti silicide layer may as well be formed.

Figure 3M:
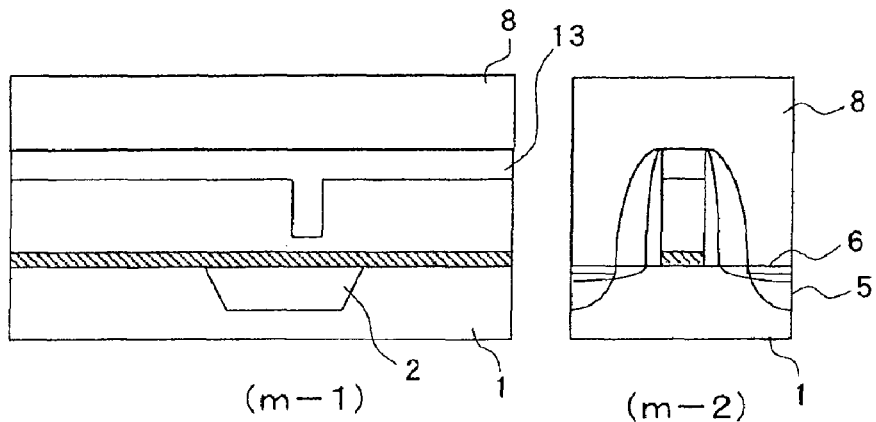
FIG. 3m is a process sectional view illustrating the manufacturing method of the semiconductor device according to the invention.
Figure 3N:
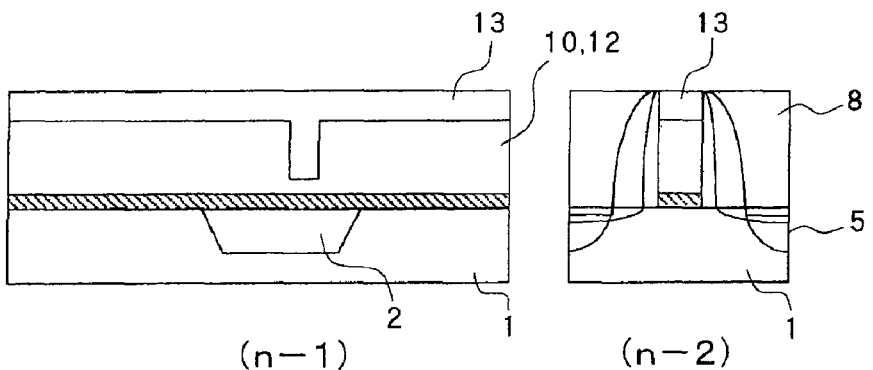
FIG. 3n is a process sectional view illustrating the manufacturing method of the semiconductor device according to the invention.

Next, interlayer insulating film 8 made up of a silicon oxide film is so formed by CVD as to embed the gate pattern and the gate side wall (FIG. 3m). Then, the surface of this interlayer insulating film 8 is flattened by the CMP (Chemical Mechanical Polishing) technique (FIG. 3n).

Figure 3O:
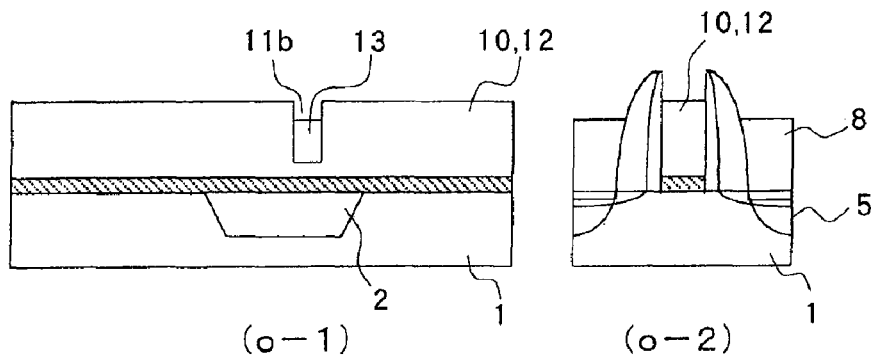
FIG. 3o is a process sectional view illustrating the manufacturing method of the semiconductor device according to the invention.

Then, interlayer insulating film 8 is etched back, and at the same time hard mask 13 over the gate pattern is removed to expose polycrystalline silicon films 10 and 12 (FIG. 3o). Hard mask 13 remains in groove 11b.

Figure 3P:
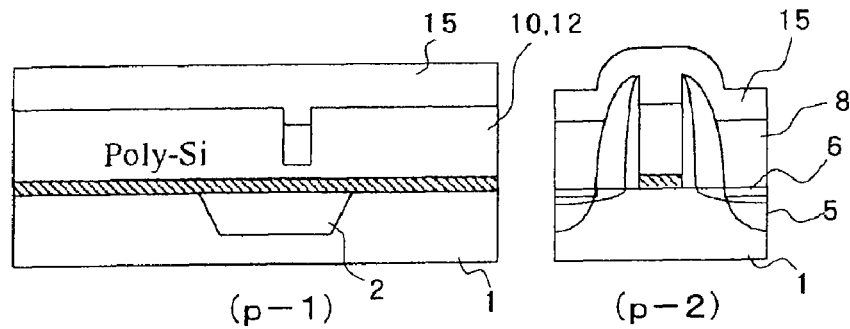
FIG. 3p is a process sectional view illustrating the manufacturing method of the semiconductor device according to the invention.

Next, metal film 15 for siliciding polycrystalline silicon films (Poly-Si) 10 and 12 of the gate pattern is formed all over (FIG. 3p). In this exemplary embodiment, a nickel film (Ni film) is formed as metal film 15. The thickness of this Ni film 15 is set to such a thickness that the whole of polycrystalline silicon films 10 and 12 is silicided by the subsequent heat treatment for silicidation and monosilicide (NiSi) is formed in this example of fabrication.

Figure 3Q:
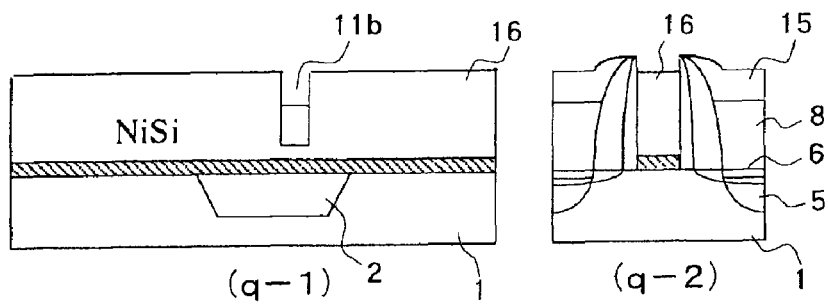
FIG. 3q is a process sectional view illustrating the manufacturing method of the semiconductor device according to the invention.

Then, heat treatment for silicidation is carried out to silicify the whole of polycrystalline silicon films 10 and 12 to form monosilicide (NiSi) layer 16 (FIG. 3q). It is preferable to carry out this heat treatment in an inactive ambiance to prevent metal film 15 from oxidation. Also, this heat treatment has to be carried out at a temperature at which sufficient diffusion velocity to silicide the whole of polycrystalline silicon films 10 and 12 to the region reaching the gate insulating film is obtained and to prevent silicide layer 6 formed in source/drain diffusion region 5 from taking on a high resistance. In this example of fabrication, since both the silicide of silicide layer 6 formed in source/drain diffusion region 5 and the silicide formed in the gate pattern are nickel silicides, the condition of heat treatment can be set to 1 to 20 minutes at 350 to 500° C. in a nitrogen gas ambiance, for instance to 2 to 5 minutes at 400° C. If silicide layer 6 formed in source/drain diffusion region 5 is Co silicide or Ti silicide, an even higher temperature region, for instance up to 800° C. can be permitted.

Figure 3R:
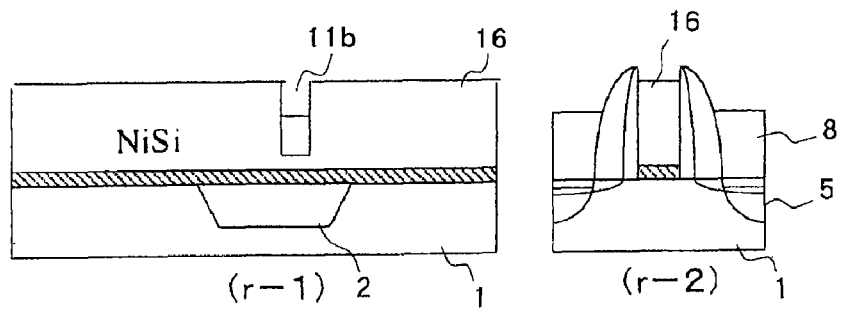
FIG. 3r is a process sectional view illustrating the manufacturing method of the semiconductor device according to the invention.

Next, a surplus of metal film 15 which was not silicided by heat treatment is removed by wet etching (FIG. 3*r*). Where metal film 15 is an Ni film, the Ni film can be readily removed without damaging the gate electrode by using a mixed solution of sulfuric acid and hydrogen peroxide water.

Figure 3S:
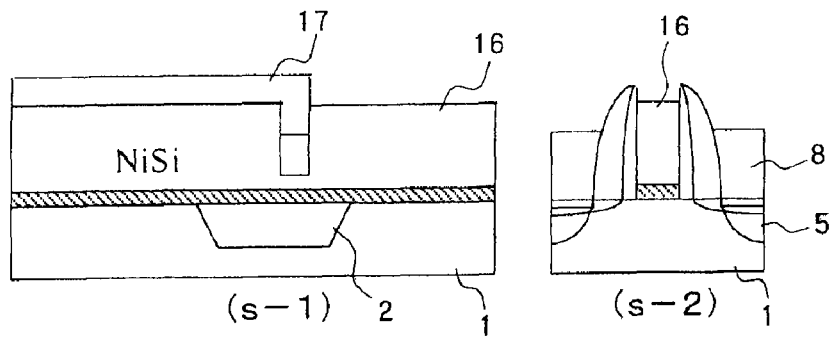
FIG. 3s is a process sectional view illustrating the manufacturing method of the semiconductor device according to the invention.

Then, hard mask 17 made up of an insulating material is so formed as to cover the P-type active region (NMOS region) and groove 11*b* (FIG. 3*s*). Then, groove 11*b* is filled with the insulating material of the hard mask.

Figure 3T:
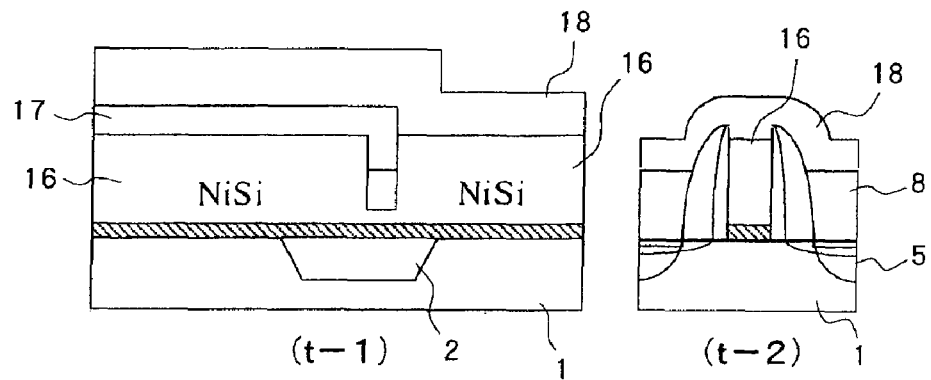
FIG. 3t is a process sectional view illustrating the manufacturing method of the semiconductor device according to the invention.

Next, Ni film 18 is formed all over to form an Ni$_3$Si layer by further siliciding the N-type active region (PMOS region) part of NiSi layer 16 (FIG. 3*t*). The thickness of this Ni film 18 is set to such a thickness that the whole PMOS region part of NiSi layer 16 in contact with the Ni film is varied to an Ni$_3$Si layer by the subsequent heat treatment for silicidation.

Figure 3U:
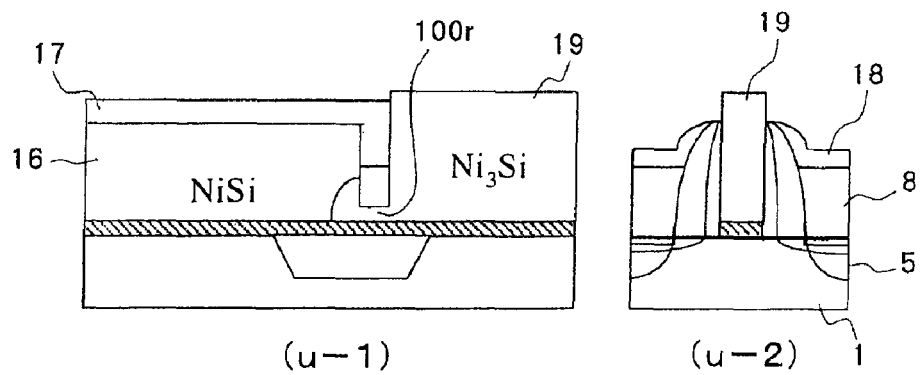
FIG. 3u is a process sectional view illustrating the manufacturing method of the semiconductor device according to the invention.

Then, the whole PMOS region part of NiSi layer 16 in contact with Ni film 18 is varied into Ni$_3$Si layer 19 by carrying out heat treatment for silicidation (FIG. 3*u*). The conditions of this heat treatment can similar to the conditions for the aforementioned heat treatment for silicidation. The progress of silicidation from the PMOS region side toward the NMOS region side is restrained by diffusion restraining region 100*r* to enable the bulging-out part made up of Ni$_3$Si to remain over element isolation region 2.

Figure 3V:
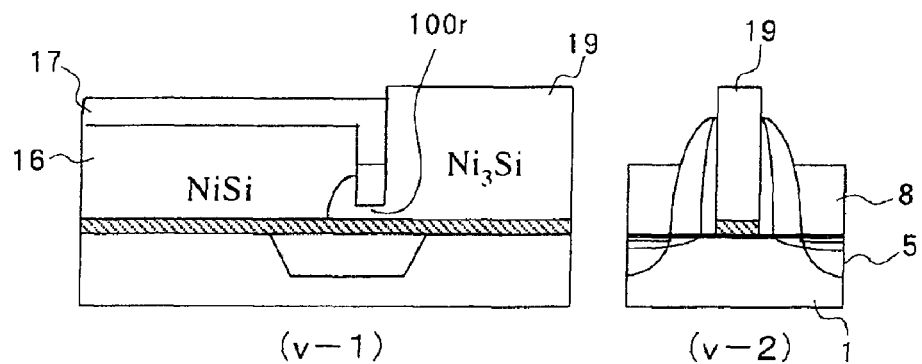
FIG. 3v is a process sectional view illustrating the manufacturing method of the semiconductor device according to the invention.

Next, a surplus of Ni film 18 which was not silicided by this heat treatment is removed by wet etching (FIG. 3*v*).

Then, an interlayer insulating film is formed and, after flattening is carried out by CMP, the step of forming contact wiring is accomplished by the usual method. From this step onward, a desired semiconductor device can be formed by the usual process.

By this example of fabrication, a semiconductor device of which the gate electrode of the NMOS is formed of NiSi, the gate electrode of the PMOS is formed of Ni$_3$Si and the gate insulating films of the NMOS and the PMOS are formed of high dielectric constant insulating films of the same type can be fabricated.

EXAMPLE OF FABRICATION 2

A second example of fabrication by the manufacturing method according to the invention will be described with reference to FIG. 4*a* through FIG. 4*m*. (a-1) of FIG. 4*a* through (m-1) of FIG. 4*m* correspond to the section along line C1-C2 in FIG. 1*a*, and (a-2) of FIG. 4*a* through (m-2) of FIG. 4*m* correspond to the section along line B1-B2 in FIG. 1*a*.

First, fabrication is accomplished in the same way as in Example of Fabrication 1 until the step described with reference to FIG. 3*g*.

Figure 4A:
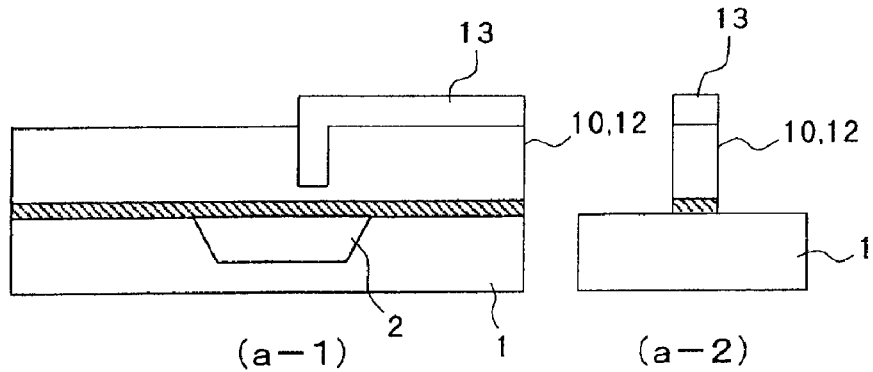
FIG. 4a is a process sectional view illustrating a manufacturing method of the semiconductor device according to the invention.

Then, hard mask 13 is so patterned as to expose the P-type active region (NMOS region) and to cover the N-type active region (PMOS region) and groove 11*b* (FIG. 4*a*).

Figure 4B:
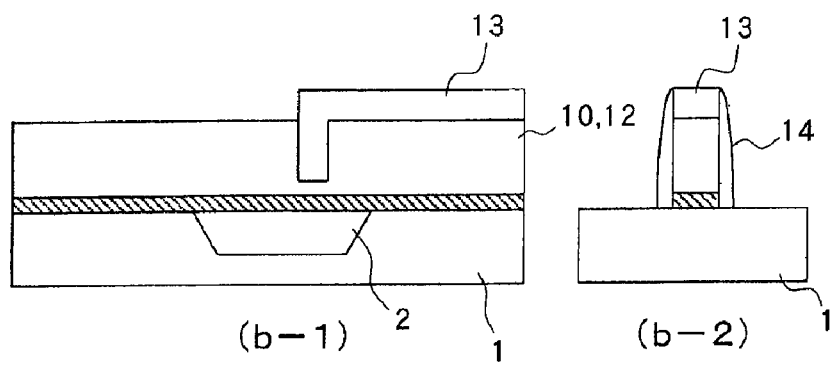
FIG. 4b is a process sectional view illustrating the manufacturing method of the semiconductor device according to the invention.

Next, spacer 14 is formed by so depositing a thin silicon oxide film by CVD as to cover the gate pattern and etching back afterwards (FIG. 4*b*).

Figure 4C:
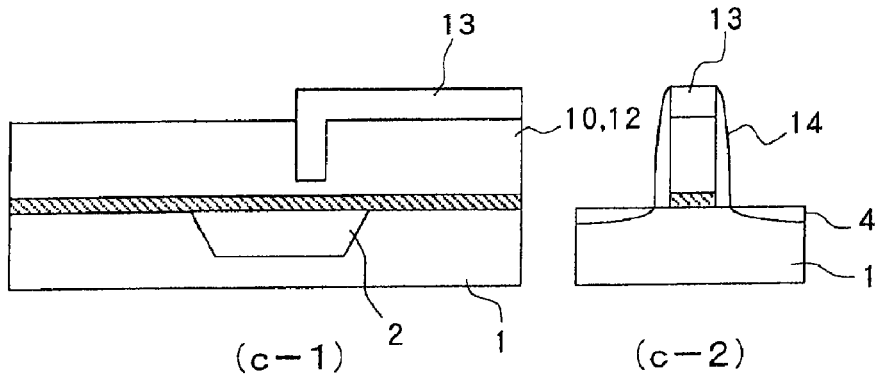
FIG. 4c is a process sectional view illustrating the manufacturing method of the semiconductor device according to the invention.

Then, ion implantation is carried out masked with the gate pattern and the spacer to form extended diffusion region 4 in a self-aligning way (FIG. 4*c*).

Figure 4D:
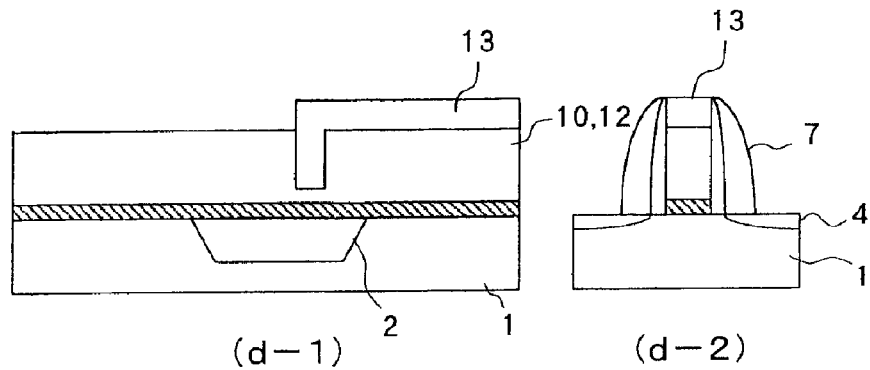
FIG. 4d is a process sectional view illustrating the manufacturing method of the semiconductor device according to the invention.

Next, a thick silicon oxide film is so deposited as to cover the gate pattern and the spacer by CVD, followed by formation of gate side wall 7 by etching back (FIG. 4*d*).

Figure 4E:
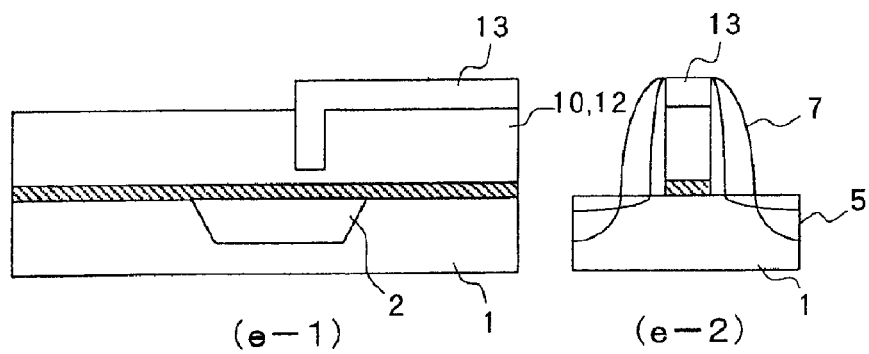
FIG. 4e is a process sectional view illustrating the manufacturing method of the semiconductor device according to the invention.

Next, ion implantation is carried out again, followed by activating annealing to form source/drain diffusion region 5 (FIG. 4*e*).

Figure 4F:
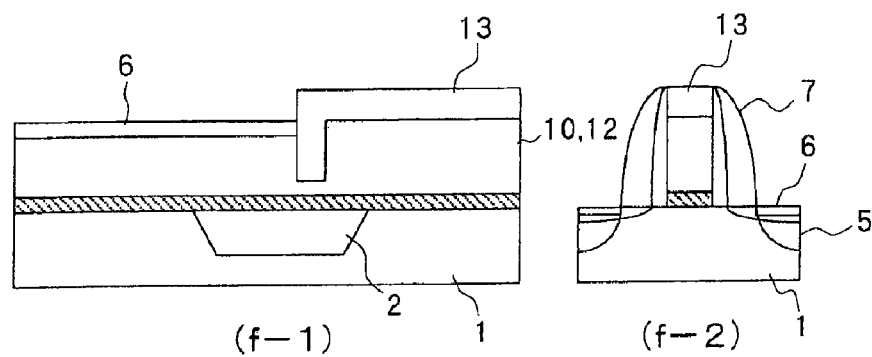
FIG. 4f is a process sectional view illustrating the manufacturing method of the semiconductor device according to the invention.

Then, an Ni film is deposited all over by sputtering, followed by the formation of nickel silicide layer 6 over the source/drain diffusion region and polycrystalline silicon films 10 and 12 of the NMOS region where no hard mask 13 is formed by the salicidation technique masked with the hard mask over the gate pattern, the gate side wall and the element isolation region (FIG. 4*f*).

Figure 4G:
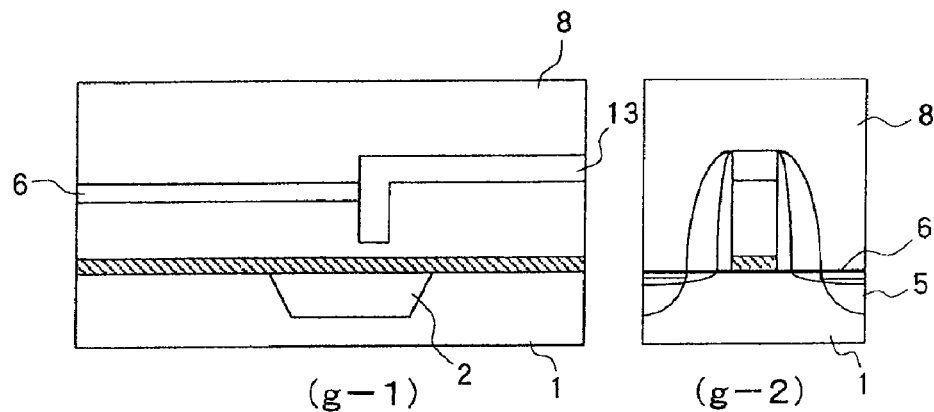
FIG. 4g is a process sectional view illustrating the manufacturing method of the semiconductor device according to the invention.
Figure 4H:
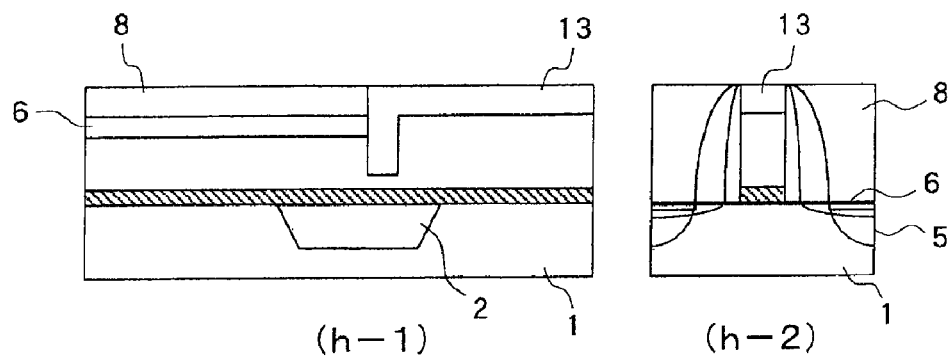
FIG. 4h is a process sectional view illustrating the manufacturing method of the semiconductor device according to the invention.

Next, interlayer insulating film 8 made up of a silicon oxide film is so formed by CVD as to embed the gate pattern and the gate side wall (FIG. 4*g*). Then, the surface of this interlayer insulating film 8 is flattened by the CMP technique (FIG. 4*h*).

Figure 4I:
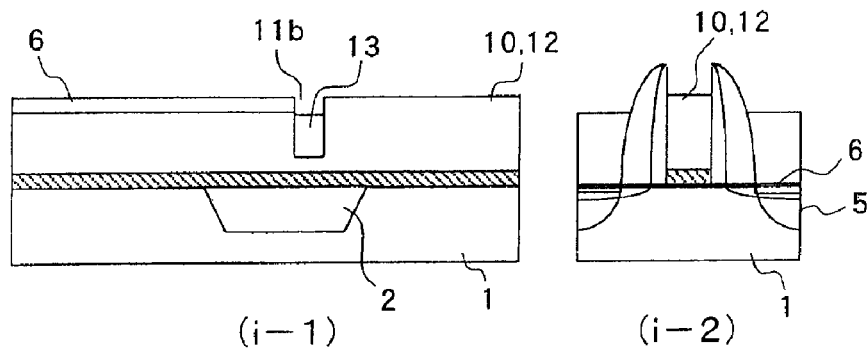
FIG. 4i is a process sectional view illustrating the manufacturing method of the semiconductor device according to the invention.

Then, interlayer insulating film 8 is etched back, and at the same time hard mask 13 over the gate pattern is removed to expose polycrystalline silicon films 10 and 12 (FIG. 4*i*). Hard mask 13 remains in groove 11*b*.

Figure 4J:
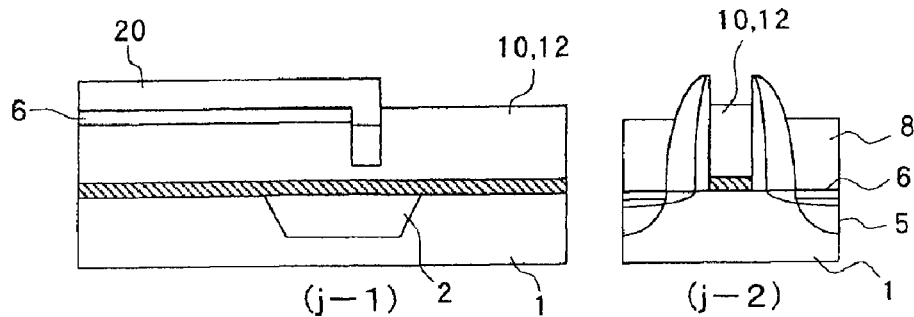
FIG. 4j is a process sectional view illustrating the manufacturing method of the semiconductor device according to the invention.

Next, hard mask 20 made up of an insulating material is so formed as to cover the P-type active region (NMOS region) side and groove 11*b* (FIG. 4*j*). Groove 11*b* is then filled by the insulating material of the hard mask.

Figure 4K:
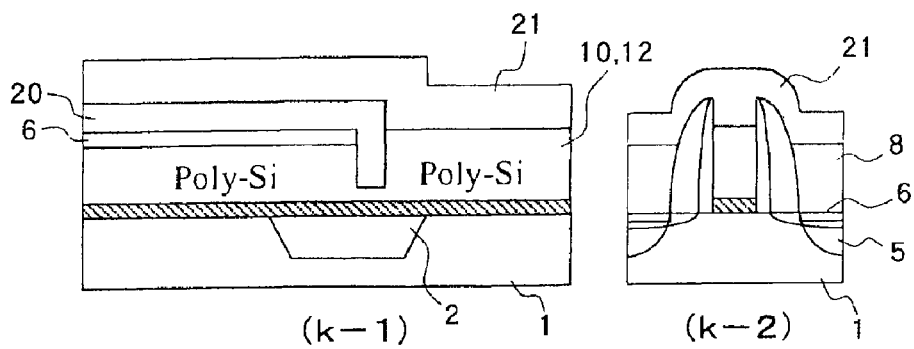
FIG. 4k is a process sectional view illustrating the manufacturing method of the semiconductor device according to the invention.

Then, Ni film 21 is formed all over to form an NiSi layer by siliciding the N-type active region (PMOS region) parts of polycrystalline silicon films 10 and 12 (FIG. 4*k*). The thickness of this Ni film 21 is set to such a thickness that the whole PMOS region parts of polycrystalline silicon films 10 and 12 in contact with the Ni film is varied to an NiSi layer by the subsequent heat treatment for silicidation.

Figure 4L:
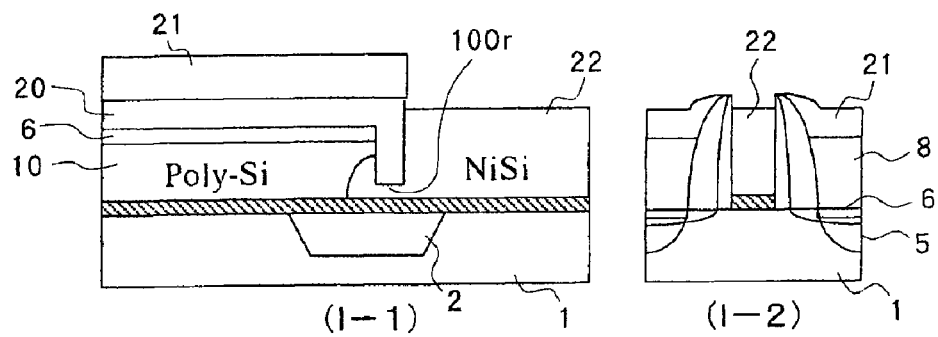
FIG. 4l is a process sectional view illustrating the manufacturing method of the semiconductor device according to the invention.

Next, the whole PMOS region part of the polycrystalline silicon film in contact with Ni film 21 is varied into NiSi layer 22 by carrying out heat treatment for silicidation (FIG. 4*l*). The conditions of this heat treatment can similar to the conditions for the aforementioned heat treatment for silicidation in Example of Fabrication 1. The progress of silicidation from the PMOS region side toward the NMOS region side is restrained by diffusion restraining region 100*r* to enable the bulging-out part made up of NiSi to remain over element isolation region 2.

Figure 4M:
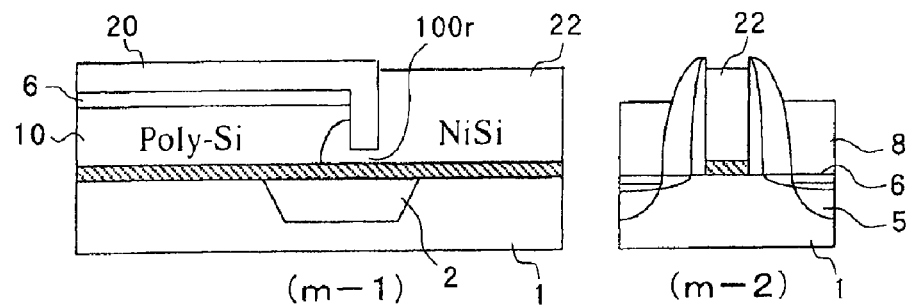
FIG. 4m is a process sectional view illustrating the manufacturing method of the semiconductor device according to the invention.

Then, a surplus of Ni film 21 which was not silicided by this heat treatment is removed by wet etching (FIG. 4*m*).

Next, an interlayer insulating film is formed and, after flattening is carried out by CMP, the step of forming contact wiring is accomplished by the usual method. From this step onward, a desired semiconductor device can be formed by the usual process.

By this example of fabrication, a semiconductor device of which the gate electrode of the NMOS is formed of polycrystalline silicon, the gate electrode of the PMOS is formed of a silicide (NiSi) and the gate insulating films of the NMOS and the PMOS are formed of high dielectric constant insulating films of the same type can be fabricated.

EXAMPLE OF FABRICATION 3

A third example of fabrication by the manufacturing method according to the invention will be described with reference to FIG. 5*a* through FIG. 5*d*. (a-1) of FIG. 5*a* through (d-1) of FIG. 5*d* correspond to the section along line C1-C2 in FIG. 1*a*, and (a-2) of FIG. 5*a* through (d-2) of FIG. 5*d* correspond to the section along line B1-B2 in FIG. 1*a*.

First, fabrication is accomplished in the same way as in Example of Fabrication 2 until the step described with reference to FIG. 4*e*.

Figure 5A:
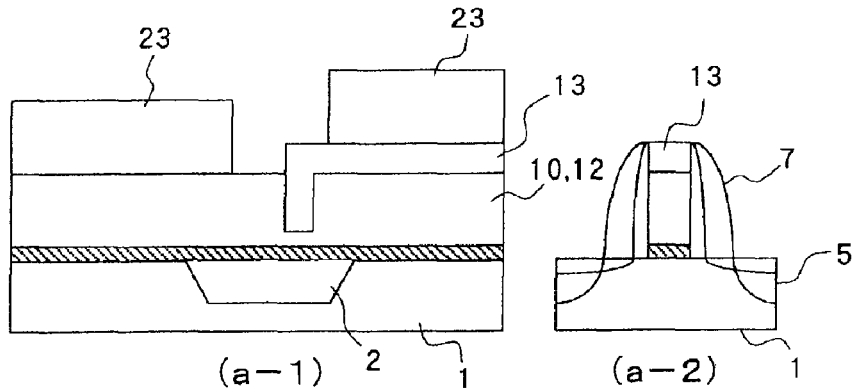
FIG. 5a is a process sectional view illustrating a manufacturing method of the semiconductor device according to the invention.
Figure 5B:
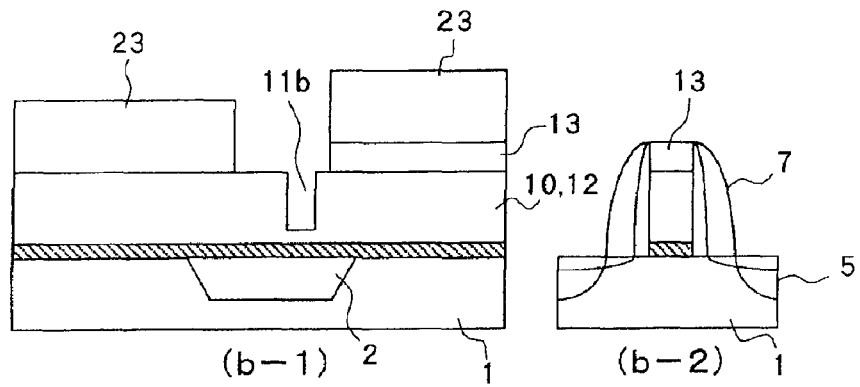
FIG. 5b is a process sectional view illustrating the manufacturing method of the semiconductor device according to the invention.

Then, resist mask 23 is so formed as to expose the region including groove 11*b* (FIG. 5*a*).

Figure 5C:
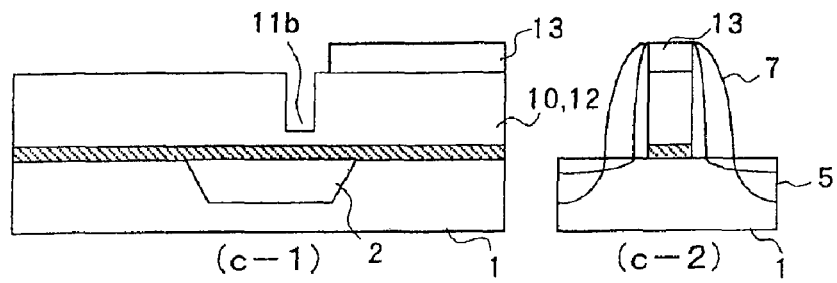
FIG. 5c is a process sectional view illustrating the manufacturing method of the semiconductor device according to the invention.

Next, hard mask 13 in the exposed region is selectively removed by etching together with the hard mask material within groove 11*b* (FIG. 5*b*), followed by removal of the resist mask (FIG. 5*c*).

Figure 5D:
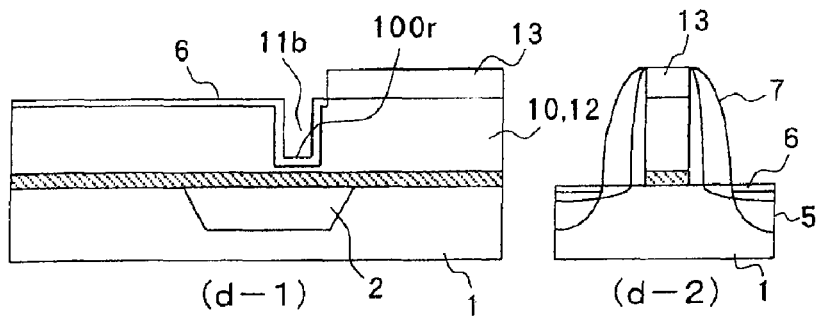
FIG. 5d is a process sectional view illustrating the manufacturing method of the semiconductor device according to the invention.

Then, an Ni film is deposited all over by sputtering, followed by the formation of nickel silicide layer 6 over the source/drain diffusion region and polycrystalline silicon films 10 and 12 of the NMOS region where no hard mask 13 is formed and in groove 11b by the salicidation technique masked with the hard mask over the gate pattern, the gate side wall and the element isolation region (FIG. 5d). As nickel silicide layer 6 is formed at this step all over the inside of the groove including the bottom face of groove 11b (diffusion restraining region 100r), electroconductivity between the NMOS side gate part and the PMOS side gate part can be enhanced.

Next, hard mask 13 is removed, and a hard mask which so covers the NMOS region including groove 11b as to fill groove 11b and exposes the PMOS region is formed. This step enables a structure corresponding to FIG. 4j of Example of Fabrication 2 to be obtained.

Then, a semiconductor device can be fabricated in a process following the step described with reference to FIG. 4k of Example of Fabrication 2.

EXAMPLE OF FABRICATION 4

A fourth example of fabrication by the manufacturing method according to the invention will be described with reference to FIG. 6a through FIG. 6f. These drawings correspond to the section along line C1-C2 in FIG. 1a.

First, semiconductor substrate 1 having element isolation region 2 formed by the STI technique, a P-type active region and an N-type active region are made ready.

Figure 6A:
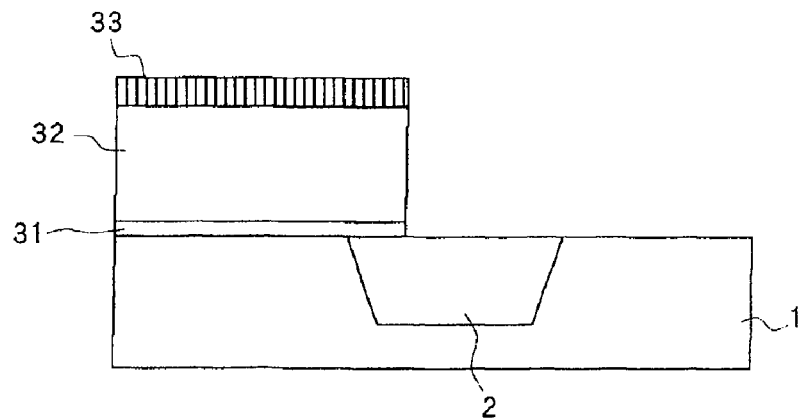
FIG. 6a is a process sectional view illustrating a manufacturing method of the semiconductor device according to the invention.
Figure 6B:
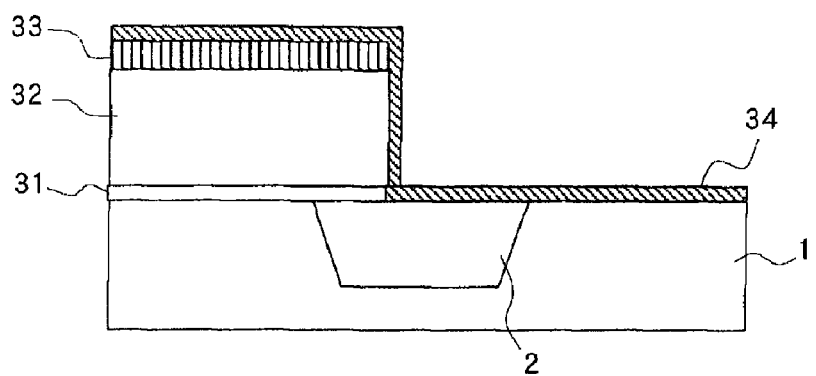
FIG. 6b is a process sectional view illustrating the manufacturing method of the semiconductor device according to the invention.

Then, silicon oxynitride film 31 is formed over the substrate, and polycrystalline silicon film 32 is formed over the same. After that, mask 33 made up of silicon nitride is formed, the polycrystalline silicon film and the silicon oxynitride film over the PMOS region is removed, and polycrystalline silicon film 32 and silicon oxynitride film 31 are left over the NMOS region (FIG. 6a).

Figure 6C:
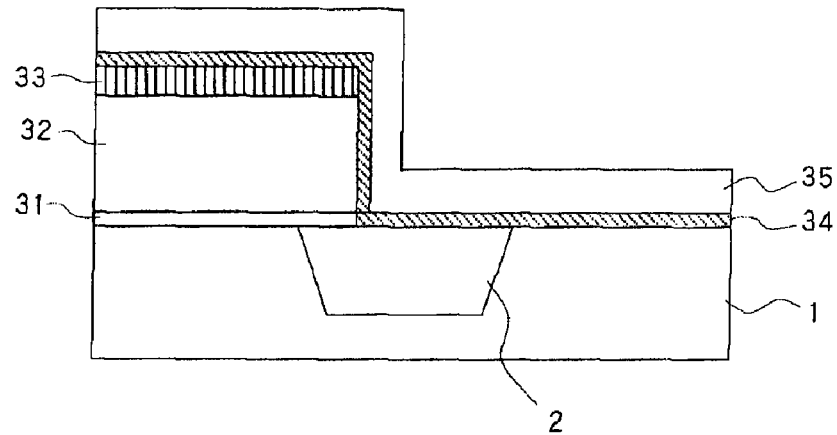
FIG. 6c is a process sectional view illustrating the manufacturing method of the semiconductor device according to the invention.

Next, high dielectric constant insulating film 34 is formed all over (FIG. 6b), and polycrystalline silicon film 35 is formed all over the same (FIG. 6c).

Figure 6D:
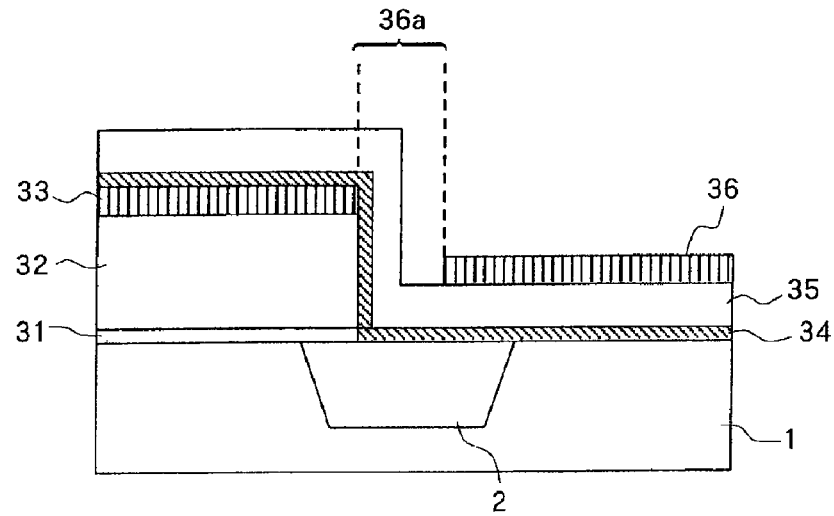
FIG. 6d is a process sectional view illustrating the manufacturing method of the semiconductor device according to the invention.

Then, mask 36 made up of silicon nitride is formed over polycrystalline silicon film 35 (FIG. 6d). This mask 36, together with mask 33 formed earlier, forms aperture 36a matching a prescribed size of the diffusion restraining region in the substrate plane.

Figure 6E:
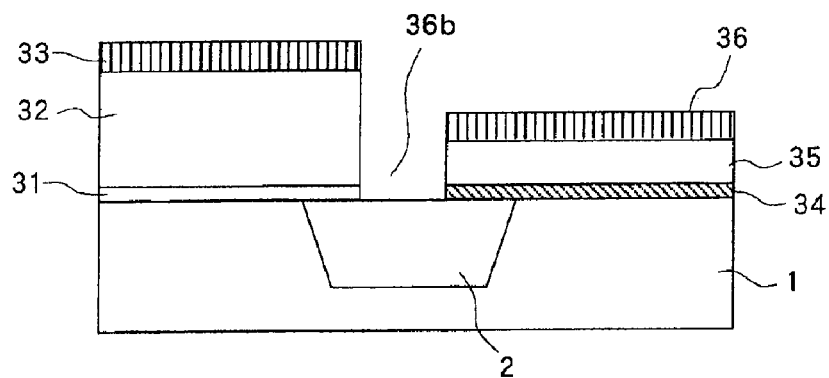
FIG. 6e is a process sectional view illustrating the manufacturing method of the semiconductor device according to the invention.
Figure 6F:
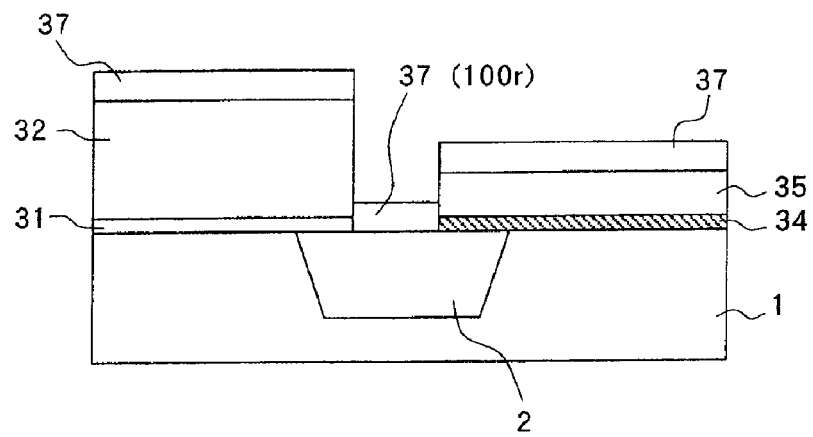
FIG. 6f is a process sectional view illustrating the manufacturing method of the semiconductor device according to the invention.

Next, polycrystalline silicon film 35 and high dielectric constant film 34 over mask 33 and in aperture 36a are selectively removed by performing Reactive Ion Etching (RIE) using mask 33 and mask 36 to form groove 36b reaching the element isolation region 2 in a lower layer is formed (FIG. 6e). This groove 36b has a size matching a prescribed planar size of the diffusion restraining region.

Then, after removing masks 33 and 36, thin polycrystalline silicon film 37 is so formed by, for instance, sputtering as to completely cover element isolation region 2 exposed on the bottom face of this groove 36b (FIG. 60. It is desirable then to perform this step under a condition to prevent a polycrystalline silicon film from being formed on the side wall within the groove as far as practicable. If any polycrystalline silicon film is formed on the side wall, a groove of a size which takes into account the thickness of the film is to be formed. Thin polycrystalline silicon film 37 formed on the bottom of groove 36b constitutes diffusion restraining region 100r.

Now, a semiconductor device can be fabricated in a process following the step described with reference to FIG. 3f of Example of Fabrication 2.

By this example of fabrication, a semiconductor device of which the gate electrode of the NMOS is formed of polycrystalline silicon, the gate electrode of the PMOS is formed of a silicide (NiSi), the gate insulating film of the NMOS is formed of silicon oxynitride film, and the gate insulating film of the PMOS is formed of a high dielectric constant insulating film can be fabricated.

In the manufacturing methods so far described, where the gate electrode of the NMOS is formed of polycrystalline silicon, electroconductivity can be provided by introducing impurities into the NMOS region part of the polycrystalline silicon film before forming the silicide layer over the gate electrode of the NMOS.

In the manufacturing methods so far described, an amorphous silicon layer may as well be formed as the base layer for the polycrystalline silicon layer to be formed over the active region.

The invention claimed is:

1. A semiconductor device, comprising:
   a semiconductor substrate;
   an element isolation region on the semiconductor substrate;
   a first active region and a second active region disposed on the semiconductor substrate and separated from each other by the element isolation region;
   a line-shaped electrode disposed from over the first active region to over the second active region via the element isolation region;
   a first field effect transistor comprising a first gate insulating film on the first active region, a first gate electrode composed of the line-shaped electrode on the first gate insulating film, and a first source/drain region in the first active region; and
   a second field effect transistor comprising a second gate insulating film on the second active region, a second gate electrode composed of the line-shaped electrode on the second gate insulating film, and a second source/drain region in the second active region,
   wherein part of the line-shaped electrode over the first active region and part of the line-shaped electrode over the second active region are formed of mutually different materials;
   the line-shaped electrode comprises a diffusion restraining region having thickness T of the line-shaped electrode in a direction perpendicular to the substrate thinner than thickness T of the line-shaped electrode over the first and second active regions, the diffusion restraining region being provided over the element isolation region and spanning the whole width of the line-shaped electrode in the gate length direction; and
   thickness Tr of the line-shaped electrode in the diffusion restraining region is not less than 10 nm but not more than 30 nm.

2. A semiconductor device, comprising:
   a semiconductor substrate;
   an element isolation region on the semiconductor substrate;
   a first active region and a second active region disposed on the semiconductor substrate and separated from each other by the element isolation region;
   a line-shaped electrode disposed from over the first active region to over the second active region via the element isolation region;
   a first field effect transistor comprising a first gate insulating film on the first active region, a first gate electrode composed of the line-shaped electrode on the first gate insulating film, and a first source/drain region in the first active region; and
   a second field effect transistor comprising a second gate insulating film on the second active region, a second gate electrode composed of the line-shaped electrode on the second gate insulating film, and a second source/drain region in the second active region, wherein part of the line-shaped electrode over the first active region and part of the line-shaped electrode over the second active region are formed of mutually different materials;

the line-shaped electrode comprises a diffusion restraining region having thickness T of the line-shaped electrode in a direction perpendicular to the substrate thinner than thickness T of the line-shaped electrode over the first and second active regions, the diffusion restraining region being provided over the element isolation region and spanning the whole width of the line-shaped electrode in the gate length direction; and the width of the diffusion restraining region in a direction perpendicular to the gate length direction is not less than 10 nm but not more than 30 nm.

3. The semiconductor device according to claim 1, wherein the first and second gate insulating films include high dielectric constant insulating films, and the line-shaped electrode over the first and second active regions are formed of a silicide.

4. A semiconductor device, comprising:
a semiconductor substrate;
an element isolation region on the semiconductor substrate;
a first active region and a second active region disposed on the semiconductor substrate and separated from each other by the element isolation region;
a line-shaped electrode disposed from over the first active region to over the second active region via the element isolation region;
a first field effect transistor comprising a first gate insulating film on the first active region, a first gate electrode composed of the line-shaped electrode on the first gate insulating film, and a first source/drain region in the first active region; and
a second field effect transistor comprising a second gate insulating film on the second active region, a second gate electrode composed of the line-shaped electrode on the second gate insulating film, and a second source/drain region in the second active region, wherein part of the line-shaped electrode over the first active region and part of the line-shaped electrode over the second active region are formed of mutually different materials;

the line-shaped electrode comprises a diffusion restraining region having thickness T of the line-shaped electrode in a direction perpendicular to the substrate thinner than thickness T of the line-shaped electrode over the first and second active regions, the diffusion restraining region being provided over the element isolation region and spanning the whole width of the line-shaped electrode in the gate length direction;

the first and second gate insulating films include high dielectric constant insulating films;

the line-shaped electrode over the first and second active regions are formed of a silicide;

the part of the line-shaped electrode over an N-type active region being the first active region is formed of a silicide having a composition represented by $Ni_xSi_{1-x}$ ($0.55 \leq x < 1$), and the part of the line-shaped electrode over a P-type active region being the second active region is formed of a silicide having a composition represented by $Ni_xSi_{1-x}$ ($0 < x < 0.55$).

5. The semiconductor device according to claim 4, wherein the part of the line-shaped electrode over the first active region is formed of a silicide whose main component is an $Ni_3Si$ phase, and the part of the line-shaped electrode over the second active region is formed of a silicide whose main component is an $NiSi$ phase or an $NiSi_2$ phase.

6. The semiconductor device according to claim 1, wherein the first and second gate insulating films include high dielectric constant insulating films, the part of the line-shaped electrode over an N-type active region being the first active region is formed of a silicide, and the part of the line-shaped electrode over a P-type active region being the second active region is formed of polycrystalline silicon at least in the lower part thereof in contact with the gate insulating film at least.

7. The semiconductor device according to claim 1, wherein the first field effect transistor and the second field effect transistor make up CMOS.

8. The semiconductor device according to claim 1, wherein the part of the line-shaped electrode over an N-type active region being the first active region is formed of polycrystalline silicon at least in the lower part thereof in contact with the gate insulating film at least, the second gate insulating film includes a high dielectric constant insulating film, and the part of the line-shaped electrode over a P-type active region being the second active region is formed of a silicide.

9. The semiconductor device according to claim 8, wherein the second field effect transistor over the second active region makes up a transistor in a DRAM cell region, and the first field effect transistor in the first active region makes up a transistor in another region.

10. The semiconductor device according to claim 3, wherein the gate insulating film including the high dielectric constant insulating film has a stacked structure comprising a silicon oxide film or silicon oxynitride film and the high dielectric constant insulating film in contact with the gate electrode.

11. The semiconductor device according to claim 3, wherein the high dielectric constant insulating film contains hafnium.

12. A method of manufacturing a semiconductor device, wherein the semiconductor device comprises:
a semiconductor substrate;
an element isolation region on the semiconductor substrate;
a first active region and a second active region disposed on the semiconductor substrate and separated from each other by the element isolation region;
a line-shaped electrode disposed from over the first active region to over the second active region via the element isolation region;
a first field effect transistor comprising a first gate insulating film on the first active region, a first gate electrode composed of the line-shaped electrode on the first gate insulating film, and a first source/drain region in the first active region; and
a second field effect transistor comprising a second gate insulating film on the second active region, a second gate electrode composed of the line-shaped electrode on the second gate insulating film, and a second source/drain region in the second active region, wherein part of the line-shaped electrode over the first active region and part of the line-shaped electrode over the second active region are formed of mutually different materials: and the line-shaped electrode comprises a diffusion restraining region having thickness T of the line-shaped electrode in a direction perpendicular to the substrate thinner than thickness T of the line-shaped electrode over the first and second active regions, the diffusion restraining region being provided over the element isolation region and spanning the whole width of the line-shaped electrode in the gate length direction; and wherein the method comprises:

preparing a semiconductor substrate including an element isolation region, a first active region and a second active region, the regions being separated from each other by the element isolation region;

forming an insulating film for a gate insulating film on the semiconductor substrate;

forming a first polycrystalline silicon film over the insulating film;

forming a groove in the first polycrystalline silicon film over the element isolation region, the groove reaching the element isolation region or the insulating film and spanning the whole width in the gate length direction of a line-shaped electrode to be formed afterwards;

forming a second polycrystalline silicon film thinner than the first polycrystalline silicon film so as to cover the whole bottom face of the groove;

forming an insulating film for masking use over the second polycrystalline silicon film so as to fill the groove;

forming a gate pattern by processing the insulating film for masking use and the first and second polycrystalline silicon films;

forming source/drain regions in the first and second active regions;

forming an interlayer insulating film so as to embed the gate pattern;

removing the interlayer insulating film until the insulating film for masking use is exposed, followed by removing the insulating film for masking use to expose the polycrystalline silicon film;

forming a metal for siliciding use all over, and conducting heat treatment such that the first and second polycrystalline silicon films are silicided to form a first silicide; and forming a mask to cover one active region and the groove, forming a metal of the same type as said metal all over, and conducting heat treatment such that a second silicide differing from the first silicide in compositional ratio is formed over the other active region to obtain a line-shaped electrode comprising a part of the first silicide and a part of the second silicide.

13. A method of manufacturing a semiconductor device, wherein the semiconductor device comprises:

a semiconductor substrate;

an element isolation region on the semiconductor substrate;

a first active region and a second active region disposed on the semiconductor substrate and separated from each other by the element isolation region;

a line-shaped electrode disposed from over the first active region to over the second active region via the element isolation region;

a first field effect transistor comprising a first gate insulating film on the first active region, a first gate electrode composed of the line-shaped electrode on the first gate insulating film, and a first source/drain region in the first active region; and a second field effect transistor comprising a second gate insulating film on the second active region, a second gate electrode composed of the line-shaped electrode on the second gate insulating film, and a second source/drain region in the second active region, wherein part of the line-shaped electrode over the first active region and part of the line-shaped electrode over the second active region are formed of mutually different materials; and the line-shaped electrode comprises a diffusion restraining region having thickness T of the line-shaped electrode in a direction perpendicular to the substrate thinner than thickness T of the line-shaped electrode over the first and second active regions, the diffusion restraining region being provided over the element isolation region and spanning the whole width of the line-shaped electrode in the gate length direction; and wherein the method comprises:

preparing a semiconductor substrate including an element isolation region, a first active region and a second active region, the regions being separated from each other by the element isolation region;

forming an insulating film for a gate insulating film on the semiconductor substrate;

forming a first polycrystalline silicon film over the insulating film;

forming a groove in the first polycrystalline silicon film over the element isolation region, the groove reaching the element isolation region or the insulating film and spanning the whole width in the gate length direction of a line-shaped electrode to be formed afterwards;

forming a second polycrystalline silicon film thinner than the first polycrystalline silicon film so as to cover the whole bottom face of the groove;

forming an insulating film for masking use over the second polycrystalline silicon film so as to fill the groove;

removing the insulating film for masking use in other region than a region including one active region and the groove;

forming a gate pattern by processing the first and second polycrystalline silicon films in a region where the insulating film for masking use is removed and by processing the insulating film for masking use and the first and second polycrystalline silicon films in a region where the insulating film for masking use is not removed;

forming source/drain regions in the first and second active regions; forming silicide layers over the source/drain regions by the salicidation technique and, at the same time, forming a silicide layer on the gate pattern in the region where the insulating film for masking use is removed;

forming an interlayer insulating film so as to embed the gate pattern;

removing the interlayer insulating film until the insulating film for masking use is exposed, followed by removing the insulating film for masking use to expose the second polycrystalline silicon film; and forming a mask to cover the groove and the active region on the side where the silicide layer is formed, forming a metal for siliciding use all over, and conducting heat treatment such that the second polycrystalline silicon in contact with the metal and the first polycrystalline silicon underneath are silicided to obtain a line-shaped electrode comprising a part of the silicide obtained by this silicidation and a part of the polycrystalline silicon over which the silicide layer is formed.

14. A method of manufacturing a semiconductor device, wherein the semiconductor device comprises:

a semiconductor substrate;

an element isolation region on the semiconductor substrate;

a first active region and a second active region disposed on the semiconductor substrate and separated from each other by the element isolation region;

a line-shaped electrode disposed from over the first active region to over the second active region via the element isolation region:

a first field effect transistor comprising a first gate insulating film on the first active region, a first gate electrode composed of the line-shaped electrode on the first gate insulating film, and a first source/drain region in the first active region; and a second field effect transistor comprising a second gate insulating film on the second active region, a second gate electrode composed of the line-shaped electrode on the second gate insulating film, and a second source/drain region in the second active region, wherein part of the line-shaped electrode over the first active region and part of the line-shaped electrode over the second active region are formed of mutually different materials; and the line-shaped electrode comprises a diffusion restraining region having thickness T of the line-shaped electrode in a direction perpendicular to the substrate thinner than thickness T of the line-shaped electrode over the first and second active regions, the diffusion restraining region being provided over the element isolation region and spanning the whole width of the line-shaped electrode in the gate length direction; and wherein the method comprises:

preparing a semiconductor substrate including an element isolation region, a first active region and a second active region, the regions being separated from each other by the element isolation region;

forming a first insulating film over at least one active region;

forming a first polycrystalline silicon film all over;

forming a first mask over the first polycrystalline silicon film at least over the one active region, and removing the first polycrystalline silicon over the region where the first mask is not formed to expose the surface of the other active region;

forming a second insulating film all over;

forming a second polycrystalline silicon film all over;

forming a second mask over the second polycrystalline silicon film over the other active region, and removing the second polycrystalline silicon film and the second insulating film in the region not covered by the masks by using the second mask and first mask to form a groove over the element isolation region, the groove reaching the element isolation region and spanning the whole width in the gate length direction of a line-shaped electrode to be formed afterwards;

forming a third polycrystalline silicon film thinner than the first and second polycrystalline silicon films so as to cover the whole bottom face of the groove;

forming an insulating film for masking use over the third polycrystalline silicon film so as to fill the groove;

removing the insulating film for masking use in other region than a region including the other active region and the groove; forming a gate pattern by processing the first and third polycrystalline silicon films in a region where the insulating film for masking use is removed and by processing the insulating film for masking use and the second and third polycrystalline silicon films in a region where the insulating film for masking use is not removed;

forming source/drain regions over the first and second active regions;

forming silicide layers over the source/drain regions by the salicidation technique and, at the same time, forming a silicide layer on the gate pattern in the region where the insulating film for masking use is removed;

forming an interlayer insulating film so as to embed the gate pattern;

removing the interlayer insulating film until the insulating film for masking use is exposed, followed by removing the insulating film for masking use to expose the polycrystalline silicon film; and forming a mask to cover the groove and the active region on the side where the silicide layer is formed, forming a metal for siliciding use all over, and conducting heat treatment such that the third polycrystalline silicon in contact with the metal and the second polycrystalline silicon underneath are silicided to obtain a line-shaped electrode comprising a part of the silicide obtained by this silicidation and a part of the polycrystalline silicon over which the silicide layer is formed.

15. The method of manufacturing semiconductor device according to claim 13, further comprising:

removing the insulating film in the groove after forming the source/drain regions, wherein a surface layer of the polycrystalline silicon in the groove is silicided in the step of forming a silicide layer over the gate pattern.

16. The method of manufacturing semiconductor device according to claim 14, further comprising:

removing the insulating film in the groove after forming the source/drain regions, wherein a surface layer of the polycrystalline silicon in the groove is silicided in the step of forming a silicide layer over the gate pattern.

17. The semiconductor device according to claim 1, wherein $Tr/Tg1<0.4$ and $Tr/Tg2<0.4$ are satisfied where Tr represents the thickness of the line-shaped electrode in the diffusion restraining region, Tg1, the thickness of the line-shaped electrode over the first active region, and Tg2, the thickness of the line-shaped electrode over second active region.

* * * * *